United States Patent
Law et al.

(10) Patent No.: US 9,377,987 B2
(45) Date of Patent: Jun. 28, 2016

(54) HARDWARE ASSISTED FORMAT CHANGE MECHANISM IN A DISPLAY CONTROLLER

(75) Inventors: Patrick Law, Milpitas, CA (US);
Darren Neuman, San Jose, CA (US)

(73) Assignee: BROADCOM CORPORATION, Irvine, CA (US)

( * ) Notice: Subject to any disclaimer, the term of this patent is extended or adjusted under 35 U.S.C. 154(b) by 1422 days.

(21) Appl. No.: 10/300,370

(22) Filed: Nov. 20, 2002

(65) Prior Publication Data

US 2004/0075664 A1    Apr. 22, 2004

Related U.S. Application Data

(60) Provisional application No. 60/420,140, filed on Oct. 22, 2002.

(51) Int. Cl.

| | |
|---|---|
| *G06F 3/00* | (2006.01) |
| *G06F 13/00* | (2006.01) |
| *G06F 13/14* | (2006.01) |
| *G06F 13/28* | (2006.01) |
| *G06F 13/36* | (2006.01) |
| *G06T 1/00* | (2006.01) |
| *G06T 1/20* | (2006.01) |
| *G06T 15/00* | (2011.01) |
| *G06F 3/14* | (2006.01) |
| *G06F 3/06* | (2006.01) |
| *G06F 13/40* | (2006.01) |
| *G06F 17/50* | (2006.01) |

(Continued)

(52) U.S. Cl.
CPC ................ *G06F 3/14* (2013.01); *G06F 3/0635* (2013.01); *G06F 3/0661* (2013.01); *G06F 13/14* (2013.01); *G06F 13/28* (2013.01); *G06F 13/4022* (2013.01); *G06F 17/5077* (2013.01); *H04N 21/431* (2013.01); *H04N 21/440263* (2013.01); *G06F 3/1423* (2013.01); *G06F 13/4027* (2013.01)

(58) Field of Classification Search
USPC ........... 710/22, 20, 72, 5, 7, 1, 305, 306, 308, 710/38, 316, 317; 348/571; 345/418, 345/501–506, 522, 530, 603
See application file for complete search history.

(56) References Cited

U.S. PATENT DOCUMENTS

| | | |
|---|---|---|
| 5,694,141 A | 12/1997 | Chee |
| 5,727,192 A | 3/1998 | Baldwin |

(Continued)

FOREIGN PATENT DOCUMENTS

JP    2002 269583    9/2002

OTHER PUBLICATIONS

New Collegiate Dictionary—A Merriam-Webster, 1974, pp. 11, 483, 793, 964.*

(Continued)

*Primary Examiner* — Tanh Nguyen
(74) *Attorney, Agent, or Firm* — Foley & Lardner LLP

(57) ABSTRACT

Systems and methods are disclosed for hardware assisted format changes in a display controller. One embodiment of the invention relates to a format change system comprising a register DMA controller and a register update list. The register update list contains at least one instruction. The register DMA controller is adapted to obtain and use at least one instruction to configure at least one display pipeline from a plurality of display pipelines in response to at least one trigger event.

21 Claims, 15 Drawing Sheets

(51) Int. Cl.
*H04N 21/431* (2011.01)
*H04N 21/4402* (2011.01)

(56) References Cited

U.S. PATENT DOCUMENTS

| | | | |
|---|---|---|---|
| 5,968,143 A * | 10/1999 | Chisholm et al. | 710/23 |
| 6,081,851 A * | 6/2000 | Futral et al. | 710/23 |
| 6,108,722 A * | 8/2000 | Troeller et al. | 710/26 |
| 6,189,064 B1 * | 2/2001 | MacInnis et al. | 710/244 |
| 6,252,610 B1 * | 6/2001 | Hussain | 345/506 |
| 6,268,875 B1 * | 7/2001 | Duluk et al. | 345/506 |
| 6,275,898 B1 * | 8/2001 | DeKoning | 711/114 |
| 6,473,780 B1 * | 10/2002 | Barcelo | 718/103 |
| 6,636,214 B1 | 10/2003 | Leather et al. | |
| 6,646,688 B1 * | 11/2003 | Rennert et al. | 348/592 |
| 6,711,651 B1 * | 3/2004 | Moreno et al. | 711/141 |
| 6,720,968 B1 * | 4/2004 | Butler et al. | 710/56 |
| 6,731,295 B1 * | 5/2004 | MacInnis et al. | 345/581 |
| 6,753,878 B1 * | 6/2004 | Heirich et al. | 345/629 |
| 6,807,620 B1 * | 10/2004 | Suzuoki et al. | 712/2 |
| 6,983,464 B1 * | 1/2006 | Bhattacharya et al. | 719/318 |
| 8,259,121 B2 * | 9/2012 | Law et al. | 345/506 |
| 2002/0062408 A1 * | 5/2002 | Jahnke et al. | 710/22 |
| 2003/0023785 A1 * | 1/2003 | Funato et al. | 710/38 |

OTHER PUBLICATIONS

European Search Report corresponding to European Patent Application Serial No. 03023961.0-1228, dated Feb. 24, 2009.

* cited by examiner

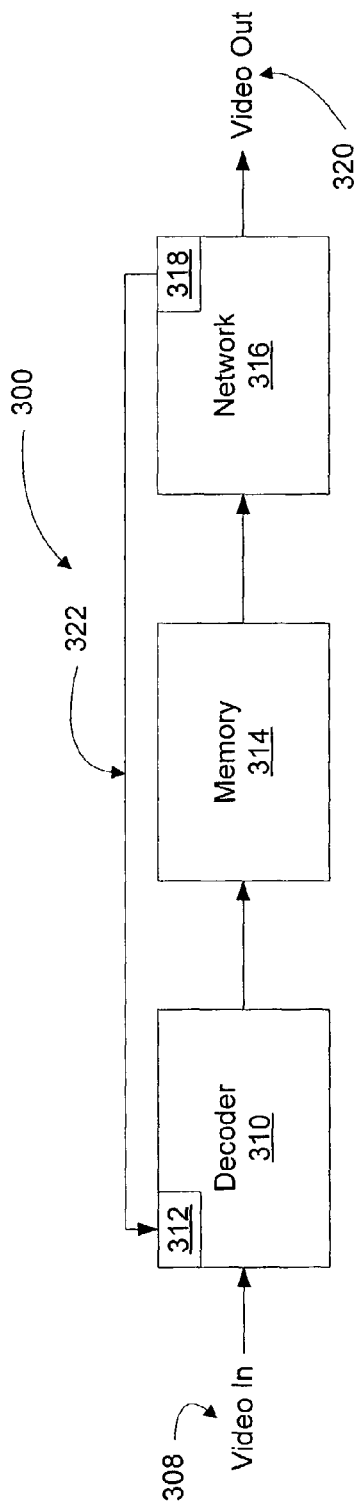
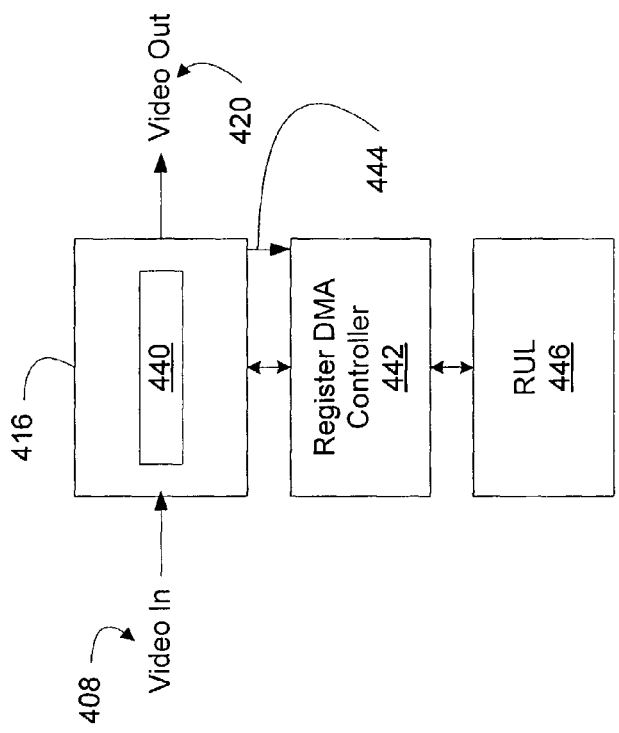

HARDWARE ASSISTED FORMAT CHANGE MECHANISM IN A DISPLAY CONTROLLER

CROSS-REFERENCE TO RELATED APPLICATIONS

This application is related to, and claims benefit of and priority from, Provisional Application No. 60/420,140 dated Oct. 22, 2002, titled "Hardware Assisted Format Change Mechanism In A Display Controller", the complete subject matter of which is incorporated herein by reference in its entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

The present invention relates to a display controller adapted to process data. More specifically, the present invention relates to a display controller environment in an A/V system and adapted to process, decode or decompress one or more input data streams (alternatively referred to as "input data", "input data streams" or "data streams").

Currently, a plurality of formats or techniques is used to compress audio-video programs for transmission and storage. See, for example, the compression standards set forth in ISO/EC IS 13818-1,2,3: Information Technology-Generic Coding of Moving Pictures and Associated Audio Information: Systems, Video and Audio (alternatively referred to as "MPEG-2") including Annex D thereof (alternatively referred to as "Annex D"); ISO/EC IS 11172-1,2,3: Information Technology-Generic Coding of Moving Pictures and Associated Audio for Digital Storage Media at up to about 1.5 Mbits/sec: Systems, Video and Audio (alternatively referred to as "MPEG-1"); Dolby AC-3; Motion JPEG, etc, each of which is incorporated herein by reference in its entirety. While only MPEG-2, MPEG-1, Dolby AC-3, Motion JPEG formats are discussed, any audio/video format is contemplated.

A/V systems are growing more complex, requiring that A/V decoders integrate more processing features or modules. A complex A/V decoder may decode several input streams simultaneously, requiring several different processing features or modules. For example one set-top box including a decoder may support two televisions. Each television may display different programs. It is contemplated that each television may be able to support picture-in-picture (alternatively referred to as "PIP"), such that each television may display two different programs simultaneously. In this example, the set-top box may also decode another program to record for future playback.

Methodological ways to connect processing modules in A/V systems are not well known. Most processing modules are connected together in an ad-hoc manner. As a result, such ad-hoc designs may become difficult to verify, maintain and reuse. Furthermore, the host is required to handle any format changes in such ad-hoc designs in a time critical manner (adding a real-time overhead burden to the host). Double buffering and interrupts are used to prevent the failure in such format changes, but display artifacts still result.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in an automated format change mechanism, device or process. More specifically, the present invention relates to such an automated format change mechanism, device or process used in a display controller that includes one or more video processing modules.

One embodiment of the invention relates to a format change system comprising a register DMA controller and a register update list. The register update list contains at least one instruction. The register DMA controller is adapted to obtain and use the at least one instruction from the register update list to configure at least one display pipeline from a plurality of possible display pipelines in response to at least one trigger event.

Another embodiment relates to a format change system comprising a register update list and a register DMA controller. The register update list contains at least one stored register write used to configure a display pipeline. The register DMA controller contains at least one descriptor, wherein the register DMA controller is adapted to generate, using stored register write, a register write used to configure at least one display pipeline from a plurality of possible display pipelines.

Another embodiment relates to a format change mechanism used in a display controller having at least one node where the format change comprises a register update list containing at least one instruction and a register DMA controller. The register DMA controller is coupled to at least the node and is adapted to obtain and use the instruction to configure at least one display pipeline comprising the node from a plurality of possible display pipelines.

Another embodiment relates to a display controller for processing data, where the display controller comprises at least a plurality of nodes, at least one link and a format change mechanism. In this embodiment, the node is adapted to process the data while the links communicate with the nodes and is adapted to transmit the data. The display controller format change system comprises a register update list containing a plurality of stored register writes and a register DMA controller coupled to at least the node and containing a plurality of descriptors, wherein the register DMA controller is adapted to generate, using the stored register write, a register write used to configure at least one display pipeline containing the node from a plurality of possible display pipelines.

Another embodiment relates to a method of initializing a display pipeline using a display controller format change device. The method comprises creating at least one register update list for the required configuration and storing said register update list. A descriptor is established that references the register update list and retrieves the register update list. The register update list is provided to at least one node in the display controller, generating at least a portion of a display pipeline using said register update list.

Another embodiment relates to a method of performing format changes in a display controller using a format change device. The method comprises receiving to a request to change a scale factor, disabling a first DMA and modifying a register update list coupled to at least said first DMA. The method re-enables the first DMA, generating at least one trigger that executes the register update list and interrupts a host coupled to the first DMA.

These and other advantages and novel features of the present invention, as well as details of an illustrated embodiment thereof, will be more fully understood from the following description and drawings.

BRIEF DESCRIPTION OF SEVERAL VIEWS OF THE DRAWINGS

FIG. 1 illustrates one embodiment of a block diagram of an A/V system having a display controller in accordance with one embodiment of the present invention;

FIG. 2 illustrates another embodiment of a block diagram of an A/V system having a display controller in accordance with one embodiment of the present invention;

DETAILED DESCRIPTION OF THE INVENTION

Figure 3:
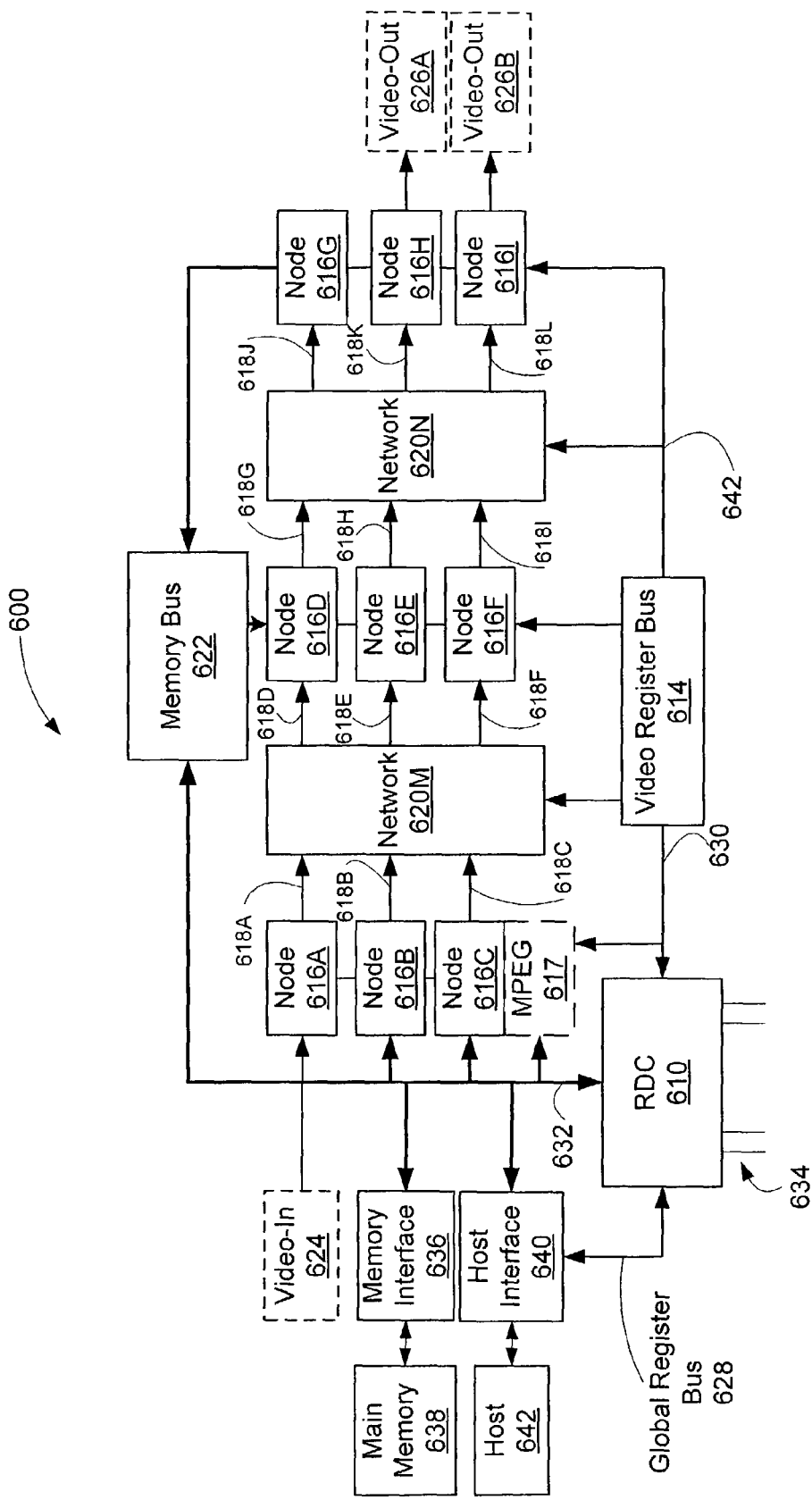
FIG. 3 illustrates one embodiment of a block diagram of a display controller environment in accordance with the present invention.

The following description is made with reference to the appended figures.

One embodiment of the present invention relates to a hardware assisted format change mechanism, device or process. More specifically, one embodiment relates to a hardware assisted format change mechanism, device or process in a display controller environment in an A/V system or decoder that decodes one or more input data streams with multiple output rates using a single clock reference. This embodiment enables video processing modules having multiple time bases to be implemented using a single clock reference (alternatively referred to as a "system clock").

FIG. 1 illustrates one embodiment of a block diagram of an A/V system, generally designated 300, having a display controller in accordance with the present invention. It is contemplated that the illustrated A/V system may be similar to those A/V systems provided previously. It is also contemplated that the display controller may be used in different systems. In this embodiment, system 300 includes a decoder 310 (an MPEG decoder for example) adapted to receive video inputs or bitstream 308. The decoder 310 includes one or more STR recovery devices 312, used, with a system clock (a fixed system clock for example) to control the data processing similar to that provided previously. However, other decoders, with or without STR recovery devices, are contemplated.

A memory or frame buffer 314 is illustrated as being coupled to the decoder 310 and receives data there from. The memory 314 is shown as being coupled to display controller 316 as illustrated, which is adapted to transport and process video or data, outputting video out or data 320. In one embodiment, the display controller 316 is adapted to support a pull data flow. The display controller 316 includes one or more counters 318 (coupled to the STR recovery device via feedback loop 322) that, along with the rate managed output device (not shown) control the data rate of the output.

FIG. 2 illustrates one embodiment of a block diagram of a display controller, similar to the display controller 316 of FIG. 1 in accordance with the present invention. In this embodiment, the display controller 416 is adapted to receive video-in 408 (from a memory for example) and output video-out 420.

FIG. 2 further illustrates at least one display pipeline 440 inside the display controller 416. In one embodiment of the present invention, the display pipeline 440 is changeably formed by chaining, coupling or concatenating one or more display controller nodes together on the fly (i.e., in real time), depending on the display controller requirements. It is contemplated that the nodes may be re-configured, so that a plurality of display pipelines 440 may be formed, each pipeline having a different functionality depending on the nodes that are concatenated together. In other words, for example, each pipeline represents a different set or combination of functions that may be performed on the input data stream. Moreover, in one embodiment, it is contemplated that the display pipeline 440 may change the display pipeline 440 every $\frac{1}{60}^{th}$ of a second for example (i.e., real time).

In this embodiment, a register DMA controller 442 (alternatively referred to as an "RDC") is illustrated as being coupled to the display controller 416 and one or more register update lists 446 (alternatively referred to as an "RUL"). The RDC 442 is adapted to support multiple, configurable pipelines 440 by accessing and fetching (i.e., obtaining) one or more instructions from the RUL 446, and uses such instructions to configure at least one display pipeline 440 from a plurality of possible display pipelines. In one embodiment, the RDC 442 accesses the RUL 446 (fetching the instructions) in response to the one or more trigger signals 444 (real time DMA trigger signals or events generated by the last node in the pipeline 440 for example). In this embodiment, the display controller 416 and RDC 442 enable reconfiguration of the pipeline without requiring that it be done one register at a time.

In accordance with one embodiment, display modes or pipelines are configured or changed using control registers. Instead of updating the display modes one at a time, the host uses the register DMA controller, feature or operation (alternatively referred to as the register DMA controller) to automate the process. In this embodiment, the Register DMA comprises three entities: a register update list, a DMA descriptor and a DMA trigger as provided below.

FIG. 3 illustrates one embodiment of a block diagram of a display controller or display engine according to the present invention. More detail about the display controller is provided in U.S. Provisional Application No. 60/420,151 filed Oct. 22, 2002, titled "Network Environment for Video Processing Modules", the complete subject matter of which is incorporated herein by reference in its entirety. In this embodiment, the display controller, generally designated 600, is adapted to support a pull data scheme. Register DMA controller 610 is responsible for register accesses within the display controller 600 (i.e., the register DMA controller 610 is a register DMA). The register DMA controller 610 connects the global register bus 628 (alternatively referred to as "RBUS") with the video register bus 614 (alternatively referred to as "VBUS"). The register DMA controller 510 connects the register bus 512 (alternatively referred to as "RBUS") with the video register bus 514 (alternatively referred to as "VBUS").

In this embodiment, at least one video-in module 624 coupled to and communicating with at least one node (Node 616A for example). Further a memory interface 636 is illustrated coupled to and communicating with at least the memory bus 622 (using memory bus interface 632 for example) and main memory 638; and a host interface 640 communicating with at least the memory bus 622 (using memory bus interface 632 for example), host 642 and register DMA controller (using interface 628 for example).

The display controller 600, in this embodiment, comprises a plurality of nodes 616 (nine nodes 616A-616I are illustrated) adapted to process video information. While only nine nodes are illustrated, more (or less) nodes are contemplated. Again, the nodes 616 process video information (node 616A is illustrated having video-in signals 624 communicating therewith, while nodes 616H and 616I are illustrated having video-out signals 626A and 626B respectively communicating therewith). In this embodiment an optional MPEG decoder 617 is illustrated as being coupled to node 616C, and communicates with video bus 614, register DMA controller 610 and memory bus 622.

FIG. 3 further illustrates a plurality of links 618 (12 links 618A-618L are illustrated). Again, while 12 links 618 are shown, a different number is contemplated. In this embodiment, the links 618 comprise a set of signals or buses that tie at least two nodes 616 together and transfer information using a predefined protocol.

Additionally, display controller 600 comprises a plurality of specialized nodes or network modules 620 that, in this embodiment, connect at least two or more links 618 together, routing information there between. It is again contemplated that, in general, the display controller 600 may include a number of display pipelines formed by chaining multiple nodes together using the network modules 620 to switch between the nodes 616, thus varying or changing the pipeline. Each pipeline starts and ends at one or more nodes 616, where it is contemplated that each node has a memory interface 636 to a frame buffer. Functions are added to the pipelines by cascading that pipeline with more nodes.

In accordance with the present invention, the RBUS 628 is connected to the VBUS 614 through the register DMA controller 610. In this embodiment, both buses use identical signaling and protocols. The register DMA controller 610 acts as a slave to the RBUS 628 and forwards all the transactions to VBUS 614. In addition, register DMA controller 610 is a Register DMA, decoupling the host from video timing using automating mode changes to configure at least one display pipeline from a plurality of possible display pipelines.

Figure 4:
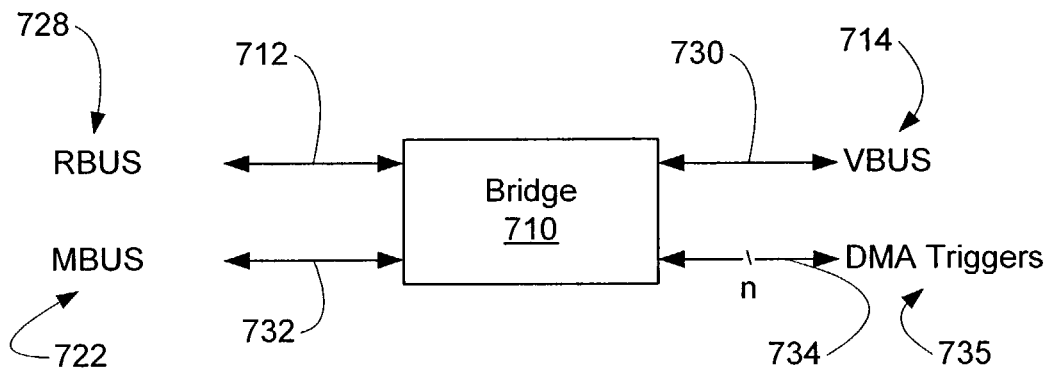
FIG. 4 illustrates one embodiment of a block diagram of a register DMA controller in accordance with one embodiment of the present invention.

FIG. 4 illustrates one embodiment of a block diagram of a register DMA controller 710 including four interfaces similar to that provided previously. There are two register bus interfaces, one interface 712 coupling the register DMA controller 710 to RBUS 728 and the other interface 730 coupling the register DMA controller 710 to VBUS 714. The third interface is a memory bus interface 732 coupling the register DMA controller 710 to the memory bus 722. Finally, interface 734 comprises an array of signals (0-n) coupled to at least one of the nodes 716, which are used as DMA triggers, and generally designated 735.

Figure 5:
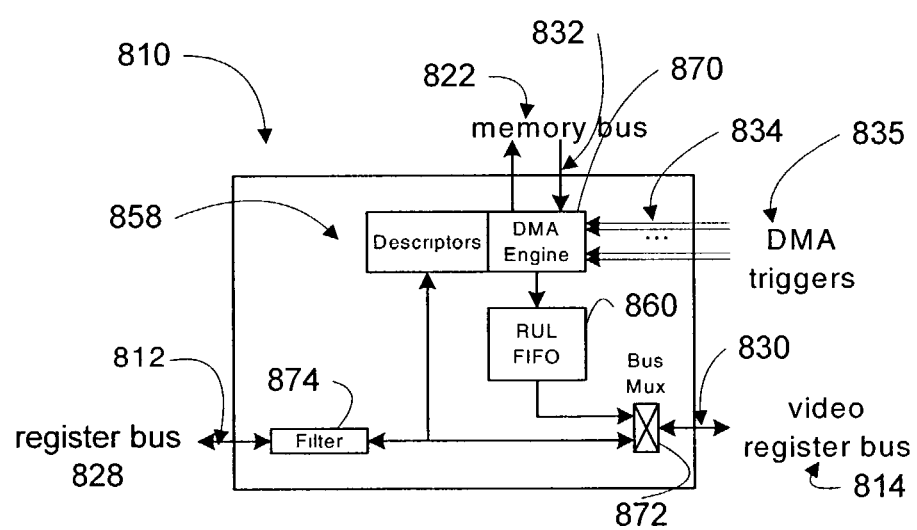
FIG. 5 illustrates another embodiment of a block diagram of a register DMA controller in accordance with one embodiment of the present invention.

FIG. 5 illustrates another embodiment of a block diagram of a register DMA controller 810 in accordance with the present invention. The register DMA controller 810 is adapted to support register DMA operations or functions. Four interfaces are illustrated as being coupled to and in communication with the register DMA controller 810 as provided previously: interface 812 coupling the register DMA controller 810 to RBUS 828; interface 830 coupling the register DMA controller 810 to VBUS 814; interface 832 coupling the register DMA controller 810 to the memory bus 822; and interface 834 comprises an array of signals, which are used as DMA triggers 835. It is further contemplated that, in this embodiment, the register DMA controller 810 is comprised of at least five modules including a DMA engine 870; descriptors 858; RUL FIFO 860; one or more BUS multiplexers 872; and one or more filters 874.

In this embodiment, the DMA engine 870 accesses one or more RULs from the main memory using the memory bus 832. The engine 870 services the DMA channels according to the configuration specified by the descriptors 858. Further, each DMA channel consists of a trigger 835 and a descriptor 858, such that, in this embodiment the number of DMA channels equals the number of triggers 835 and descriptors 858.

Register DMA controller 810 further comprises an RUL FIFO 860 coupled to at least the DMA engine 870, which is adapted to buffer the bursty memory bus 822 into the slower register bus. In this embodiment, the size of the RUL FIFO 860 is optimized to reduce the DMA response time. The register DMA controller further includes at least one transaction filter 874 that, in one embodiment, lowers the DMA response time by reducing the traffic on the video register bus 814. The filter 874 is adapted to screen the register bus 812, forwarding accesses related to the video register bus 814. A bus multiplexer or mux 872 is illustrated as being coupled to the RUL FIFO 860 and filter 874, and is adapted to convert RULs into individual register writes. In addition, the BUS mux 872 arbitrates the video register bus 814 between the DMA register writes and register accesses filtered from the register bus 812.

Figure 6:
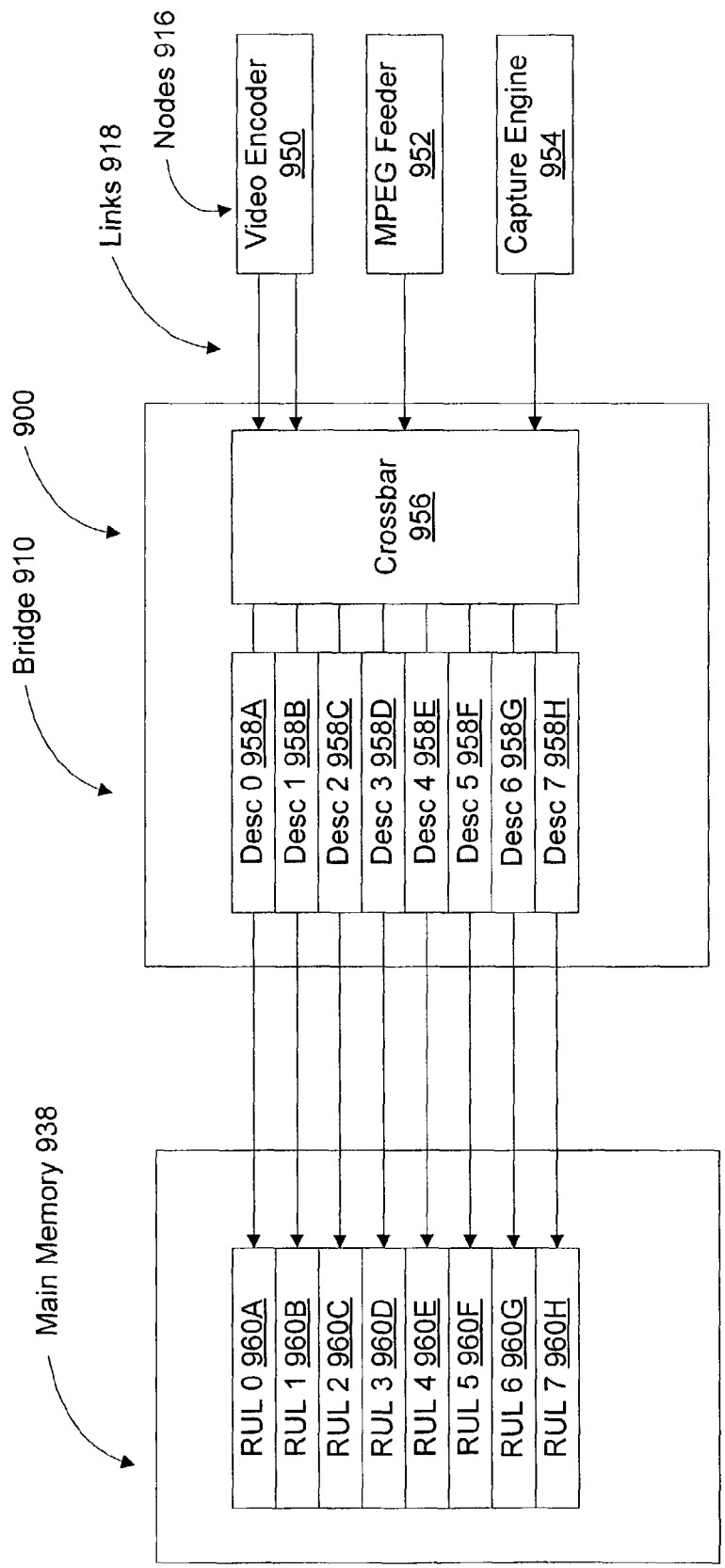
FIG. 6 illustrates one embodiment of a block diagram of a register DMA in accordance with one embodiment of the present invention.

FIG. 6 illustrates one embodiment of a register DMA in accordance with the present invention. In accordance with this embodiment, display pipelines are configured or changed using control registers. Instead of updating the control registers one at a time, the host may use the Register DMA, generally designated 900, to automate such updating. In this embodiment, an exemplary Register DMA 900 comprises at least three entities: a register update list, a DMA descriptor and a DMA trigger event or signal.

In the illustrated embodiment, the Register DMA 900 comprises a Register DMA Controller 910 that is coupled to and communicates with at least one or more nodes 916 and main memory 938. In this illustrated embodiment, the nodes 916 comprise a video encoder 950, an MPEG Feeder 952 and a Capture Engine 954 that communicate with the register DMA controller 910 via Register Bus or DMA triggers 918 (four DMA triggers are illustrated), although a different number of DMA triggers are contemplated. Register DMA controller 910 comprises a plurality of DMA descriptors 958 (eight DMA descriptors 958A-958H are illustrated, although a different number of DMA descriptors are contemplated). Furthermore, the main memory 938 comprises at least a plurality of RULs 960 (e.g., RULS 960A-960H are illustrated, although more or less are contemplated). Each descriptor 958 references at least one RUL 960 in the main memory 938, where the trigger event or signal is selected from one of the DMA triggers or links 918 using a switch 956 (a crossbar switch for example, although other switches are contemplated).

A register update list 960 (alternatively referred to as "RUL") is, in this embodiment, a data structure containing a plurality of words is created by the host and stored in the main memory 938. In one embodiment, every two words in the list represent an address-data pair of a register write. In general, a RUL contains lists of register writes used for a mode change (i.e., change to display pipelines for example). It is converted by the register DMA controller 910 into real register writes using DMA operations.

In accordance with the present invention, the register DMA controller uses at least one DMA descriptor 958 as an RUL reference. It is implemented as a control register in the register DMA controller 910 using, for example, the following fields: a trigger selector, a pointer, a word count, a mode field, two status bits (referred to as "in progress" and "done" bits) and an interrupt enable bit. The trigger selector determines the DMA triggering source (i.e., nodes 916) using at least one DMA trigger. The pointer and word count specify the address and length of an RUL, respectively.

The mode field controls the DMA triggering method (i.e., how an RUL is executed). The mode field in this embodiment has four settings: disable, immediate (executes immediately), single-trigger (executes at next trigger), and repeat-trigger (executes at every trigger). For immediate and single-trigger modes, the mode field is non-sticky (i.e., disabled automatically when the channel is triggered). Otherwise, the mode field is sticky in repeat-trigger mode. As soon as the DMA is triggered, the "in progress" bit is set. When the DMA operation is completed, the "in progress bit" is cleared and the "done" bit is set. The host is interrupted if interrupt is enabled. The status bit is reset automatically when the host reads it. In register DMA controller 910, each DMA descriptor 958 stands for a DMA channel. However, multiple DMA channels may be supported using one or more DMA descriptors 958.

In one embodiment, a DMA trigger is a single bit signal or event generated by a node 916. It is used to notify a register DMA controller 910 that a particular event has occurred in that node 916. For example, the video encoder 950 may support two programmable triggers 918. One such trigger may be set at the start of top field and the other may be set at the start of bottom field. Another example is a trigger generated by a capture engine used to indicate the end of a captured field. A number of these triggers may be hardwired from different nodes 916 to register DMA controller 910. These triggers are selected by each DMA descriptor 958 using a trigger selector. As a result, a single DMA trigger may set off or trigger multiple RULs 960.

Figure 7:
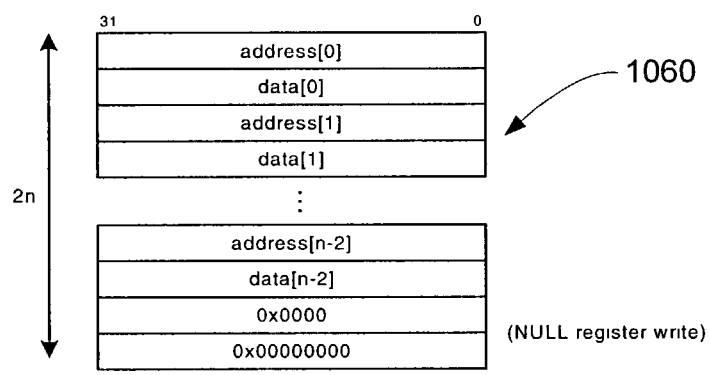
FIG. 7 illustrates one embodiment of a block diagram of an RUL in accordance with one embodiment of the present invention.

One embodiment of an RUL, generally designated 1060, is illustrated in FIG. 7. The illustrated RUL 1060 contains a plurality of register writes. Each register write is, in this embodiment, an address-data pair that may consist of two 32-bit words. In the first word, the lowest 16 bits specifies the address while the upper 16 bits are not used. The second word contains the data for the register write. The last entry in the RUL is a dummy register write which is indicated by a NULL address field. This entry is used to delimit successive register DMA operations.

Figure 8:
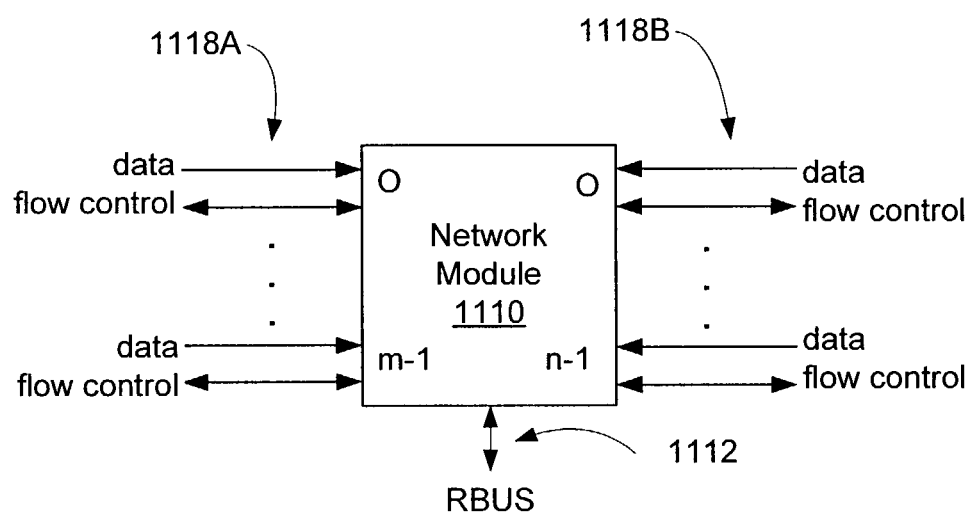
FIG. 8 illustrates one embodiment of a block diagram of a network module in accordance with one embodiment of the present invention.

FIG. 8 illustrates one embodiment of a network module 1110 in accordance with the present invention. In this embodiment, the network module 1110 comprises a plurality of network interfaces or links, generally designated 1118, and switches. One or more network modules are used to connect one or more nodes, forming one display pipeline from a plurality of possible display pipelines. Since the nodes may be re-configured, it is contemplated that display pipelines having different functionality may be implemented for different applications. In other words, the display pipelines are dynamic and not static.

The network interfaces 1118, in this embodiment, comprise input and output links 1118A & 1118B respectively, and an register bus 1112. In this embodiment, m input links 1118A and n output links 1118B are illustrated, where m and n may be the same or different. It is contemplated that m may be greater than, equal to or less than n (i.e., the number of input links 1118A may be greater than, equal to or less than the number of output links 1118B).

It is contemplated that different types of network modules may be used within the register DMA controller or display engine. The network module 1220, in accordance with the present invention, is comprised of an array of switches coupled together using predefined topology. This topology determines the network module's routing capabilities, as well as the implementation cost.

In accordance with the present invention, a multi-stage network module may comprise at least one 2×2 switch box 1221 as illustrated in FIG. 10A. Although a 2×2 switchbox is discussed, other switches are contemplated. Each switch box 1221 is, in this embodiment, a two-input two-output interchange device. The switch box has four functions as illustrated: straight, designated 1270A; exchange, designated 1270B; upper broadcast, designated 1270C; and lower broadcast, designated 1270D. For bijections interchanges (i.e., one-to-one connections) such broadcast functions are not used.

Figure 9A:
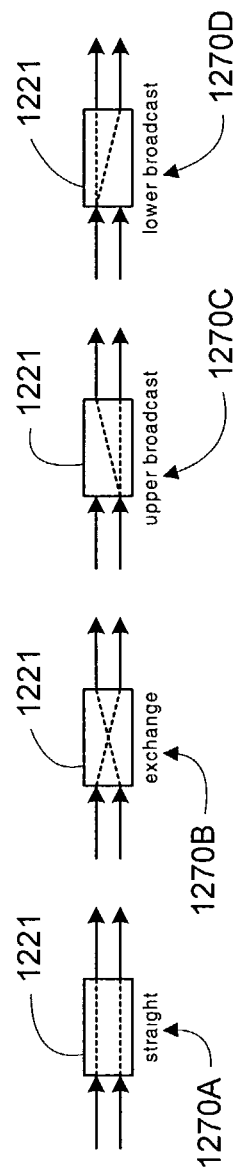
FIGS. 9A, 9B and 9C illustrate embodiments of switches used in a network module in accordance with one embodiment of the present invention.
Figure 9B:
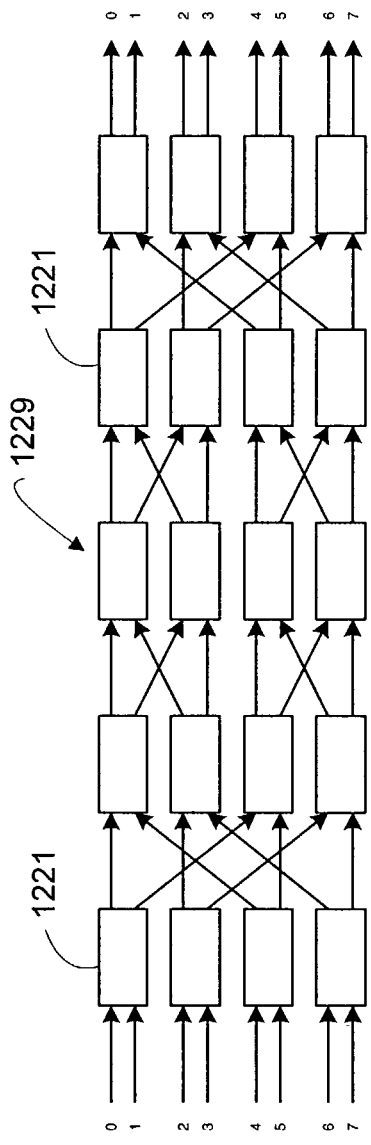

It is contemplated that, in the present invention, multiple switch boxes may be coupled together to form a subset of multi-stage network modules. FIG. 9B illustrates a Beneš network module, generally designated 1229. In the illustrated embodiment, the N×N Beneš network module 1229 comprises 2 log(N)−1 levels. The first and last log (N) levels comprise two butterfly network modules, where the middle level is shared between the two butterflies. The Beneš network module 1229 is a rearrangeable network module. However, it is contemplated that any new connections in the Beneš network module may require a complete reordering of the internal connections.

Figure 9C:
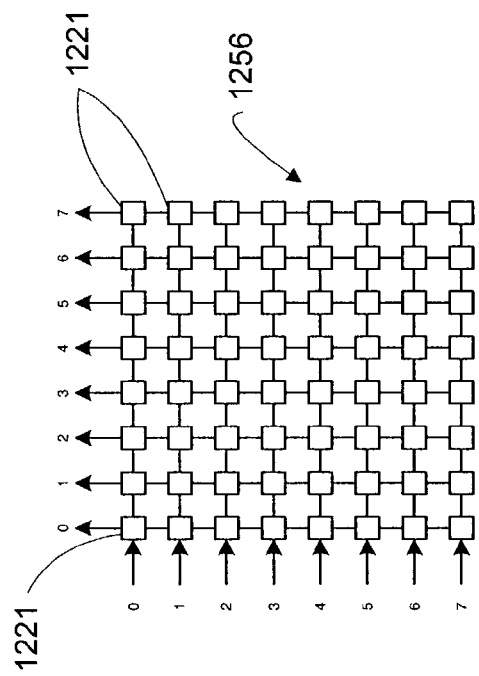

FIG. 9C illustrates a crossbar network module 1256, comprising a plurality of switches 1221. In this embodiment, the crossbar network module 1256 is a non-blocking network, adapted to handle all possible connections without blocking. This enables the network to map any input to any output. Furthermore, a connection may be set up or torn down dynamically without affecting the existing connections. In one embodiment, the switch boxes 1221 in the crossbar network module 1256 are different from those provided previously, representing a tap from the horizontal data bus to the vertical data bus.

In accordance with the present invention, control registers are utilized to set up the network module routing. Two types of control structures (i.e., individual stage control and individual box control) are discussed with respect to setting up or establishing such network module routing, although other control structures are contemplated. In individual stage control, the same register is used to set up all switch boxes within the same stage. In other words, all the switch boxes assume the same state. This simplifies the control design but may be considered inflexible. In individual box control, each switch box may be configured independently. This independent configuration generally requires more hardware when compared to the individual stage control, but it offers greater flexibility.

In addition to the two types of control structures, three methods for configuring network modules are discussed, although other methods are contemplated. One method to configure a network module comprises using an asynchronous control scheme, which is considered the simplest of the three. The switch boxes of the network module may be configured directly using the register bus by packing their control signals into a number of registers. The host may set up or tear down connections by programming different values into these registers. However, as the register writes are asynchronous to video timing, such register writes have to be handled carefully to avoid interrupting the display. In a non-blocking network module, this may be accomplished using a Register DMA. In a blocking or rearrangeable network module, additional buffering may be used at the network modules' outputs in order to accommodate the pipeline bubbles created during the reconfiguration.

Another method for configuring network modules comprises semi-synchronous control, which is an extension of the asynchronous control scheme discussed previously. This extension may be accomplished using double buffering and a trigger mask. Firstly, semi-synchronous control double buffers all the switch box control registers. Front registers control the switch boxes while back registers are programmed by the host. The front registers are updated by the back registers when a force update bit is set or a trigger signal is generated by a trigger mask as provided below.

Secondly, the semi-synchronous control method uses a trigger mask. In this embodiment, the trigger mask contains an array of bits, each bit corresponding to an input port of the display controller. A trigger signal is generated at the end of a video stream for which the mask bit is set. During initialization, the host uses a force update bit to program the network module. Afterward, the host reconfigures the network module by programming the back registers and setting a mask bit accordingly. At the end of the video stream corresponding to the mask bit, the display controller is automatically reconfigured. One benefit associated with such exemplary semi-synchronous control method is that reconfiguration may be automatically synchronized to video timing.

Another method for configuring network modules comprises synchronous control. This method requires that the display controller connections be changed synchronously with video streams. Such synchronization may be achieved using control packets to configure the network modules. The network module creates a connection using the control packets, forwarding subsequence packets according to the resulting route. If a packet is forwarded to an occupied output link, the packet is stalled until that link is free.

The display controller carefully accommodates format changes for the display engine, as even a slight mistake may be noticeable on a display. In accordance with one embodiment of the present invention, control registers are used to set one or more nodes in the display controller. Three methods for implementing the control registers are discussed, although other methods are contemplated. One method, referred to as "single buffering", relies on the fact that the values of some control registers are designated "don't care" during certain periods of time during the transmission (e.g., vertical blanking). These registers may be modified freely during such period without any damaging effect.

Another method for implementing the control registers comprises using double buffering, which may be implemented using a pair of front (i.e., "current") and back (i.e., "next") registers. The front register provides the current control information while the back register may be updated in the background. A properly timed signal is used to copy the content of the back register to the front register. This method may be used in situations where the window for register updating is small or the control doesn't allow any slack for a format change.

Yet another method for implementing control registers comprises an inband control method, wherein control information is embedded within the data stream, such that the control information and the data stream share a single path. This method requires synchronization between the control information and the data stream. It is contemplated that, in this method, format changes may be performed rapidly, even in a heavily pipelined design. This method is well suited for high performance designs such as 3D graphics processors.

Figure 10:
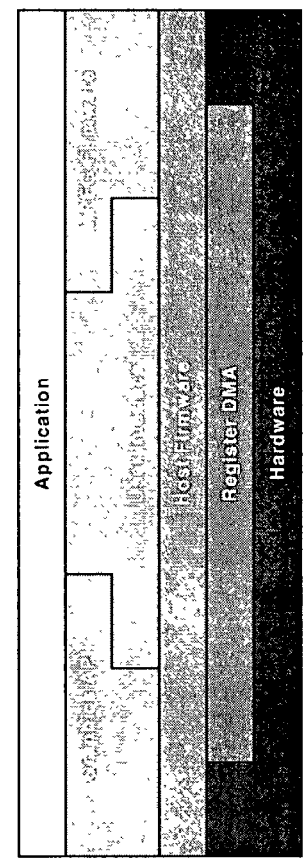
FIG. 10 illustrates one embodiment of a programming model in accordance with one embodiment of the present invention.

FIG. 10 illustrates a programming model for a display engine in accordance with one embodiment of the present invention. As illustrated, the program module is divided into a plurality of layers (i.e., application, graphics API, MPEG firmware, User interface, host firmware, register DMA and hardware) so that the overall programming is partitioned into manageable portions.

The application layer represents the display engine functions. These functions may include, for example, TV viewing, displaying 2D applications such as a web browser, 3D games, etc. The application layer interfaces to three different sub-layers: the graphics API, the user interface and the MPEG bitstream.

The graphics API layer is sub-layer containing API calls related to the display pipeline. For example, such API calls may include calls to change a frame buffer resolution, to modify a display's gamma, to swap a buffer, etc. Some portion of this sub-layer may be staggered with the user interface sub-layer.

The MPEG firmware sub-layer accommodates the MPEG video presentation. This layer manages such parameters as pan-scan offsets, aspect ratio, display size, etc. Furthermore, the MPEG firmware may be staggered with the User interface sub-layer similar to the Graphics API sub-layer.

The user interface sub-layer enables user interaction and display configuration. This sub-layer performs tasks such as showing a picture-in-picture or PIP, scaling for a wide screen display, and setting up component video output. It is contemplated that a portion of this sub-layer may be affected by the Graphics API and the MPEG Bitstream sub-layers, for example displaying MPEG video as PIP. The display format managed by the MPEG Bitstream sub-layer combines with the display information stored in the User Interface sub-layer to generate the correct display setting.

The host firmware layer comprises a collection of drivers, interrupt handling routines, and other utilities used to control the underlying hardware. A large portion of this programming goes through the Register DMA layer, reducing its real-time burden. The remaining of this programming interacts with the Hardware layer directly.

The register DMA layer comprises, in one embodiment, the register DMA controller and the DMA triggers. Theoretically the DMA layer may be considered part of the hardware layer. This layer illustrates the functionality of the Register DMA layer.

The hardware layer represents the display engine hardware. This layer interfaces with the upper layers using data buses, control registers, interrupts, programmable I/Os, etc.

A flow control valve is used, in one embodiment of the invention, as a device to control data flow in a display controller. The flow control valve sequences video data and controls information inside the display engine. Such valve acts primarily by stalling and restarting the flow control signals of at least one link. An exemplary flow control valve maintains synchronization between video and control with minimum effort. Four flow control valve modes (i.e., Manual On Manual Off, Manual On Auto Off, Auto On Manual Off and Auto On Auto Off) are discussed, although other modes are contemplated.

The Manual On Manual Off type of flow control valve may be turned on and off by writing to the valve's control register. The Manual On Auto Off type of flow control valve is turned on manually. However, the type of flow valve senses a trigger signal to shut itself off, where the signal may be an external signal or a bit from the content of a link (e.g., an end of field signal).

The Auto On Manual Off type of flow control valve is the opposite of the Manual On Auto Off type of flow control valve. However, in this embodiment, the Auto On Manual Off type of flow control valve uses an external trigger signal. The Auto On Auto Off type of flow control valve uses two trigger signal inputs: trigger on and trigger off.

Six examples of the register DMA are discussed below. The first four examples (i.e., display initialization, time critical format changes, interlock format change and pipelined mode) illustrate format change scenarios commonly found in display engines similar to that illustrated in FIG. 3. The last two examples (i.e., crossbar network switching and Beneš network switching) illustrate network connection switching using the Register DMA. In the illustrated examples, register DMA controller 610 connects the global RBUS 628 to the VBUS 614, node 616A is a video decoder, node 616C is a video feeder, node 616B is a playback engine, node 616D is a graphics compositor; Nodes 616E and 616F are scalers, Node 616G is a capture engine, nodes 616H and 616I are video encoders and modules 620M and 620N are network modules.

It is contemplated that for these examples, the register DMA controller 610 supports multiple DMA descriptors, wherein DMA triggers 634 from various nodes are connected to the register DMA controller 610. The video decoder 616A decodes analog video and produces video data where, in these examples, the video decoder is free running and synchronous to its input. It is also contemplated that the video feeder 616C is instructed by the MPEG decoder 617 to fetch and display decoded pictures in the frame buffer. The control information is sent from the MPEG decoder 617 and the host 642 using one or more register writes. In addition, a Manual On Auto Off flow control valve is included at the output of the video feeder. It is contemplated that, in this example, the video feed shuts off automatically at the end of every field.

It is also contemplated that, at least with respect to the illustrated embodiment, the playback engine 616B fetches and displays 4:2:2 pictures in the frame buffer. Further, as the buffer has to be swapped explicitly in this example, the playback engine stops at the end of every field and is re-enabled. The graphics compositor combines a stream of video and graphics surfaces into a single output. The scalers (nodes 616E and 616F) perform horizontal and vertical scaling, where the scaler control and filter coefficients are single buffered. Capture engine or node 616G is adapted to capture pictures into a frame buffer.

It is contemplated that, in these examples, the video encoders (i.e., nodes 616H and 616I respectively) determine the timing of various steps in the format change process. The video encoders in these embodiments support a number of programmable DMA trigger signals and may trigger at any raster location (at the last active pixel of a field for example).

The network modules 620, in this example, implement the asynchronous control scheme. The network module connections may be changed directly by writing to its control registers.

Even though the MPEG decoder 617 is not a node, it plays a very important role in a format change process. First of all, the decoder 617 interrupts the host 642 if a format change is detected in a bitstream. The format information is passed to the host using message registers. In addition, the decoder has two other special purpose registers. The first register is referred to as a Trigger Mask Register. This register may be used to generate DMA trigger signals. The second register is referred to as a Display Status Register. This register may be used to interrupt the MPEG decoder's firmware when a non-zero value is written. In this embodiment, the MPEG decoder is connected as part of the video register bus.

Figure 11A:
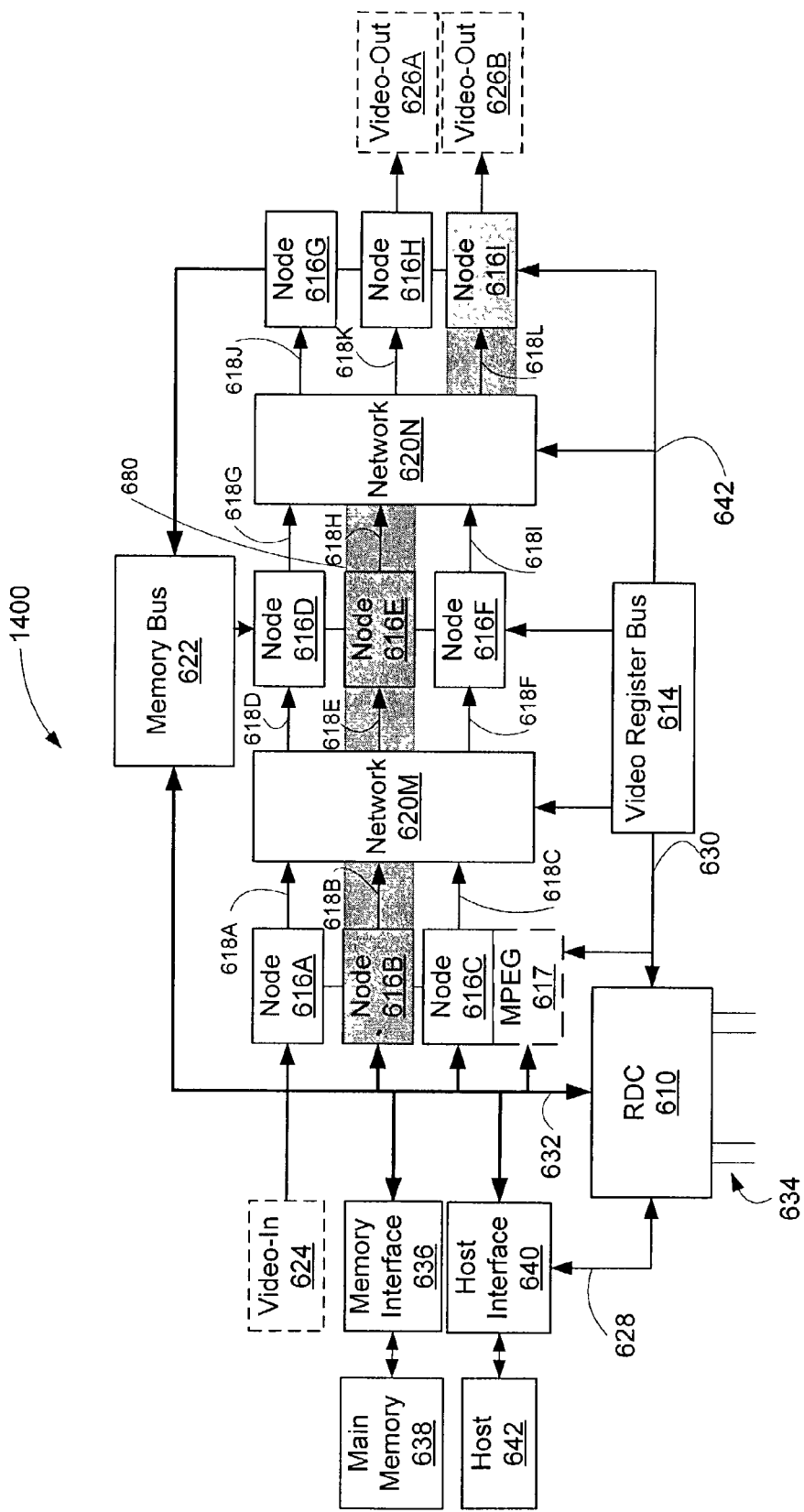
FIG. 11A illustrates one embodiment of a block diagram of a display controller similar to that illustrated in FIG. 3, illustrating display initialization in accordance with one embodiment of the present invention.

FIG. 11A illustrates an example of display initialization using a register DMA. In the illustrated example, the task is to set up or establish a display pipeline 680 (highlighted in FIG. 16) by coupling, connecting or concatenating various nodes 616 through network modules 620M and 620N, including the video feeder (node 616B), the scaler (node 616E) and the video encoder (node 616I) in display controller 1400. It is contemplated that a video source (not shown) is set up for the playback engine.

Figure 11B:
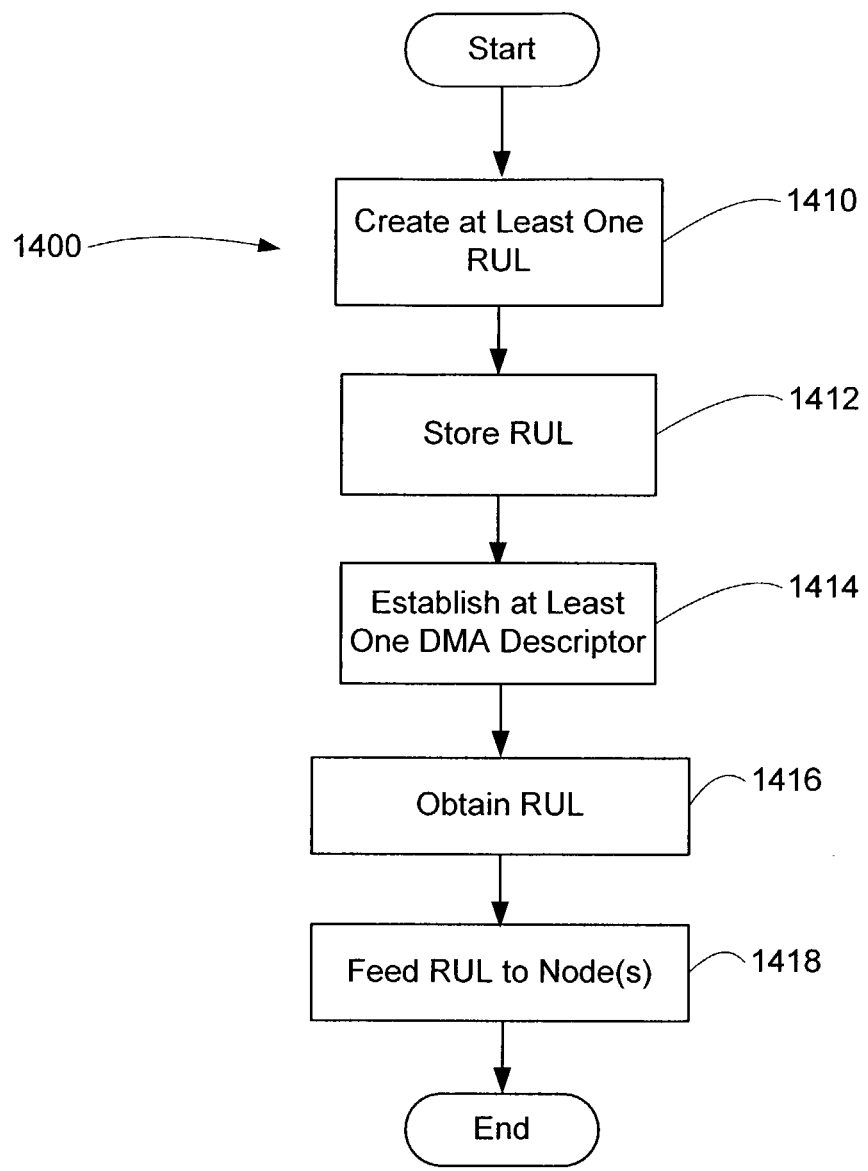
FIG. 11B illustrates one embodiment of a flow chart of a method of initializing a display pipeline in accordance with one embodiment of the present invention.

FIG. 11B illustrates a flowchart depicting a method of initializing a display pipeline in accordance with one embodiment of the present invention. In this embodiment, initialization of the display pipeline 680 may comprise host 642 creating at least one RUL for the required configuration upon reset as illustrated by block 1410, storing that RUL in the main memory 638 (using host interface 640 and memory interface 626) as illustrated by block 1412. Upon completing the RUL, the host 680 sets up or establishes a DMA descriptor in the register DMA controller 610 as illustrated by block 1414, which references the RUL in "immediate trigger" mode.

The Register DMA Controller completes the initialization process by fetching, obtaining or retrieving the RUL, and feeding it to various nodes, Graphics Compositor (Node 616D), the scaler (node 616F) and the video encoder (node 616I) for example, and network modules 620M and 620N, as illustrated by blocks 1416 and 1418. In addition, the host 642 may be notified at the end of the DMA by turning on the interrupt enable in the DMA descriptor. It is also contemplated that, in one embodiment, pre-building a number of RULs for different configurations may speedup creating the RUL for the configuration as provided previously.

Another example of a format change scenario, a time-critical format change requires that such format change take place at a specific or predetermined time. For example, the scale factor of the scaler (node 616F for example) may be changed during vertical blanking. Typically, this change is accomplished using double buffering or some interrupt driving programming. This change may also be accomplished using the register DMA in accordance with the present invention.

In the example illustrated in FIG. 11A, the display pipeline 680 comprising at least nodes 616B, 616E, and 616I is shown. It is contemplated that the display pipeline 680 responds to a request to change the scale factor of node 616E for example and update its coefficient table. It is contemplated that, in this example, no changes are made to nodes 616B and 616I.

To accommodate such change, the hardware may be configured such that one of the programmable DMA triggers of the video encoder (node 616I) is configured to trigger at the end of every field (alternatively referred to as the "End-Of-Field Trigger"). Further a DMA channel in the register DMA controller 610 (alternatively referred to as the "End-Of-Field DMA") is configured.

The DMA descriptor is referenced or transmitted to an RUL containing register writes to enable a swapping buffer and re-enabling the playback engine. In this embodiment, the video encoder's End-Of-Field Trigger in a "repeat trigger" mode triggers the DMA. Further, at the beginning of every field, the host 642 determines if there are any requests to change the display format. The host 642 services such request by adding the register writes required for such format change in front of an End-Of-Field RUL. Once the DMA is serviced, the RUL change is reverted.

Figure 12:
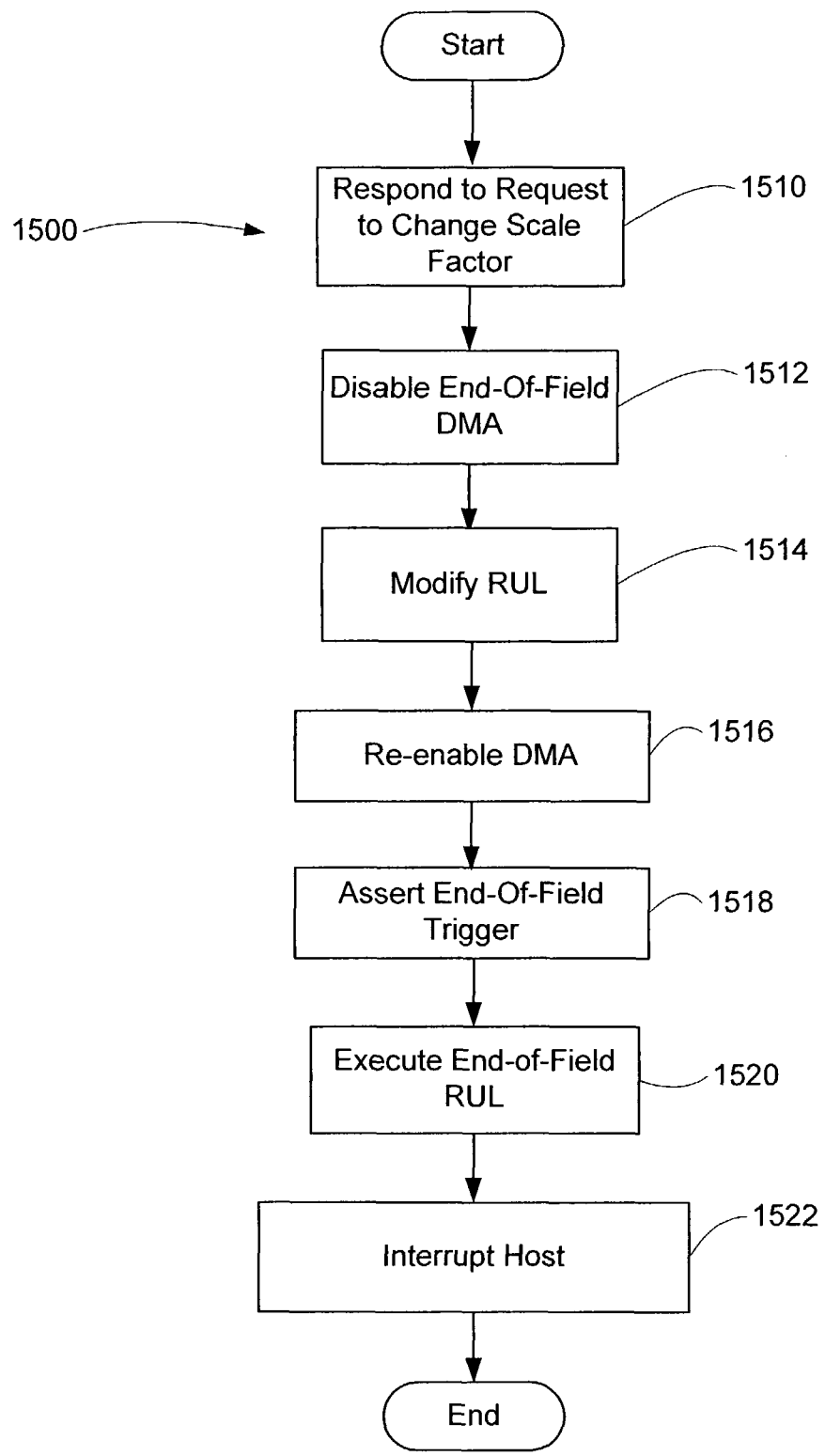
FIG. 12 illustrates one embodiment of a high level flow chart of a method for time-critical format change in accordance with one embodiment of the present invention.

FIG. 12 illustrates one embodiment of a method for time-critical format changes, generally designated 1500, using a display controller in accordance with the present invention. In this embodiment, the host 642 responds to a request to change the scale factor as illustrated in block 1510. The host 642 disables the End-Of-Field DMA and modifies its RUL as illustrated by blocks 1512 and 1514. The host 642 then re-enables the DMA as illustrated by block 1516.

According to the present method, the video encoder (node 616I) outputs the last pixel of a field and asserts one or more End-Of-Field Triggers as illustrated by block 1518. Register DMA controller 610 executes one or more End-Of-Field RULs to update the scaler (node 616F) as illustrated by block 1520. The register DMA controller 610 interrupts the host 642 when complete as illustrated by block 1522.

The previously described example illustrates two benefits of using an exemplary embodiment of the Register DMA. First, the host 642 does not have to perform any timing critical task during the format change process. It is contemplated that the field time is sufficient to enable the host 642 to modify the DMA and its RUL. Second, as the DMA is automated, it may be timed properly such that almost all double buffered registers may be eliminated. As a result, a large number of registers may be updated (e.g. scaler's coefficients).

In the example illustrated in FIG. 11A, a display pipeline comprising at least nodes 616B, 616E and 616I is shown. It is contemplated that, in one example, the display pipeline 680 responds to a request to change the scale factor of the scaler (node 616E) and update its coefficient table. It is contemplated that, in this example, no changes are made nodes 616B and 616I.

In one embodiment of the present invention, a format change may be initiated by a bitstream. Such a format change may not take effect immediately (i.e., in the next display field) as factors such as decode latency, display reordering, presentation time stamp, etc. may affect such format change. Instead of being triggering by the video encoder as provided previously, the DMA may be triggered by the MPEG decoder. In this embodiment, the MPEG decoder determines when the picture with the new format is displayed.

It is contemplated that the display pipeline in this embodiment is different from the example provided previously example, as in this embodiment nodes 616C, 616E and 616I are used, where node 616C is a video feeder. In this embodiment the flow control valve at the output of the video feeder or node 616B shuts off automatically at the end of every field. One of the programmable DMA triggers of the video encoder or node 616I is configured to trigger at the end of every field (alternatively referred to as the "End-Of-Field Trigger").

In this embodiment, three DMA channels of the register DMA controller 610 are established here. The first DMA channel is referred to as the End-Of-Field DMA. The video encoder's End-Of-Field Trigger in "repeat trigger" mode triggers this DMA channel. The DMA channel's descriptor references a RUL that writes a non-zero value to the MPEG decoder's Display Status Register. The second DMA is referred to as the Format Change DMA. This DMA is triggered by a signal, referred to as the Format Change Trigger, communicated by the MPEG decoder in "single trigger" mode. This DMA's descriptor references a RUL that contains the register writes for the new format. In addition, the last entry of the second DMA is a write to the MPEG decoder's Trigger Mask Register, which initiates or sets off the third DMA (alternatively referred to as a "Default DMA"). The third DMA is triggered by a signal, referred to as the Default Trigger, communicated by the MPEG decoder in "repeat trigger" mode. This DMA descriptor references a RUL, which contains register writes (for example, a register write to re-open the video feeder's flow control valve) used in every field.

In this embodiment, when the format change is detected in a bitstream, the MPEG decoder interrupts the host 642 and posts the new format information on its message registers. The MPEG decoder's firmware is interrupted at the end of every field by the End-Of-Field the DMA's write to the Display Status Register. The decoder firmware responds to the interrupt by clearing the registers, and then triggers another Register DMA by writing to that DMA's Trigger Mask Register. If the next field does not have the new format, the Default DMA is triggered. At the end of the DMA, the feeder's flow control valve is re-opened and the next field is displayed. However, if the next field has a new format, the Format Change DMA is triggered. In this embodiment, the host postpones any format change request requiring the same resource (the scaler 616I for example) as the bitstream's format change until the bitstream's format change has been completed.

Figure 13A:
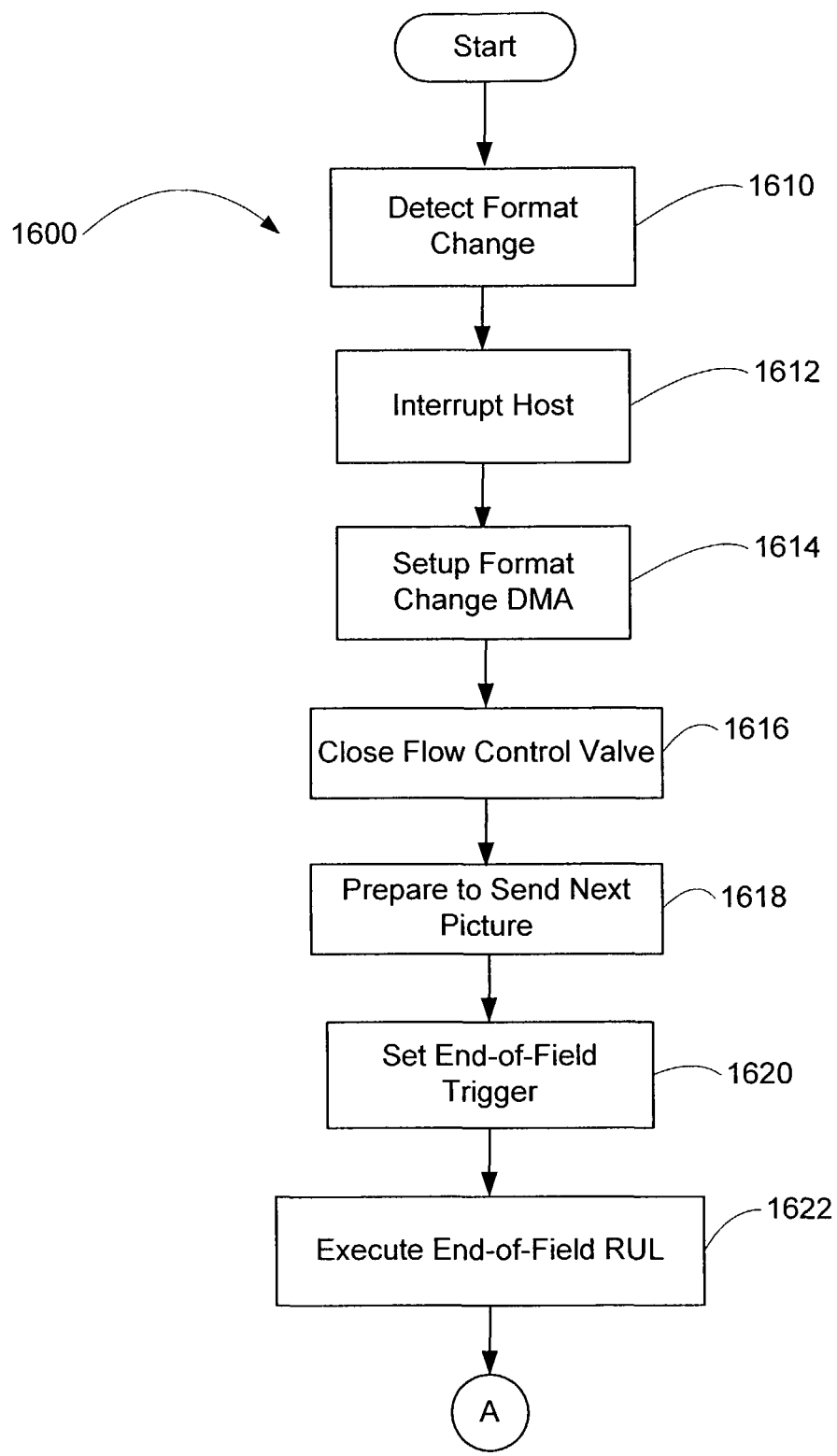
FIGS. 13A and 13B illustrate one embodiment of a flow chart of a method for format change in accordance with one embodiment of the present invention.
Figure 13B:
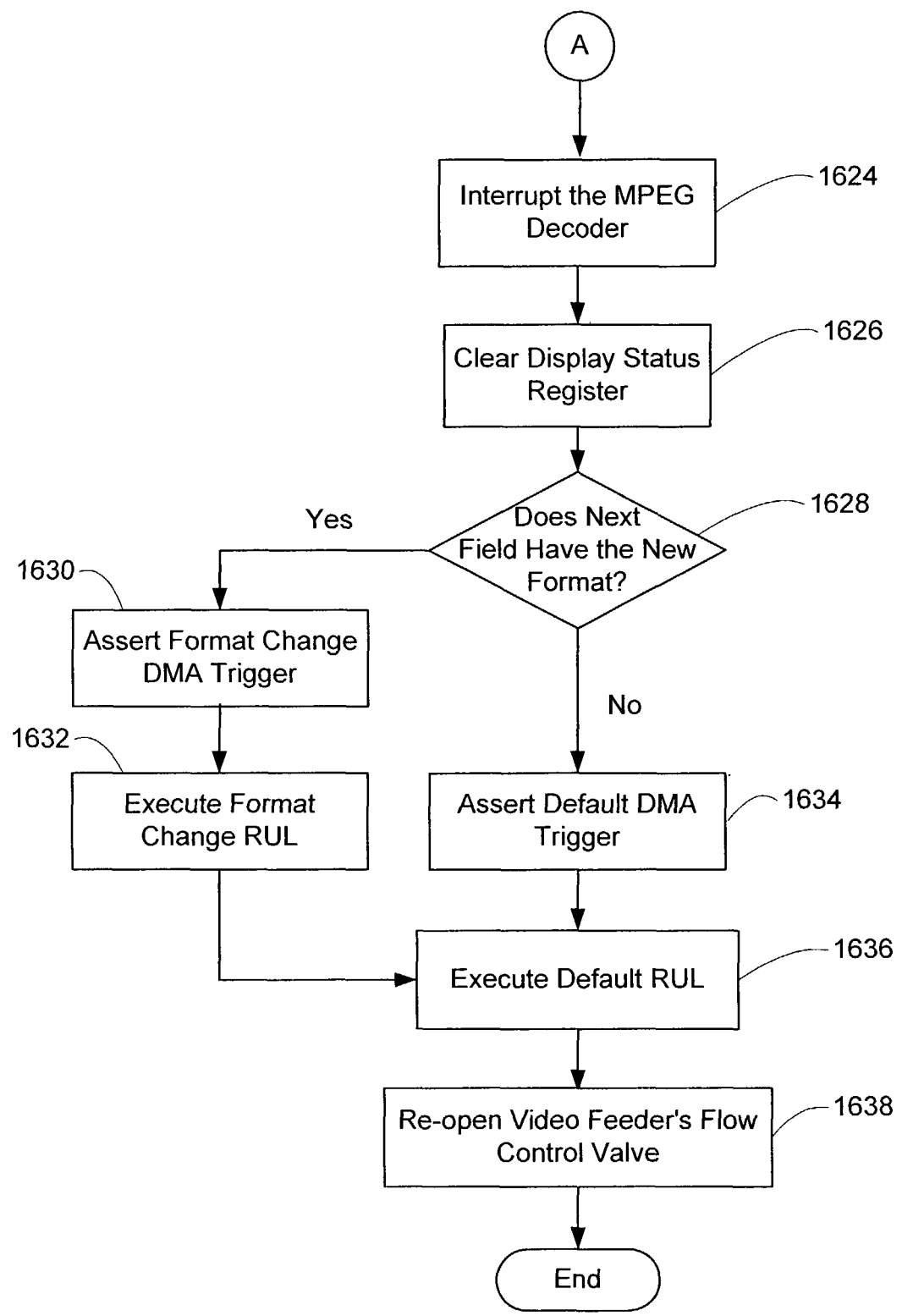

In accordance with the present invention, one embodiment of a method for a format change is illustrated in FIGS. 13A and 13B. The MPEG decoder video feeder detects a format change as illustrated by block 1610. The host 642 is interrupted as illustrated by block 1612. The host 642 picks up the format change information and creates a format change RUL. The host creates or sets up one or more format change DMAs as illustrated by block 1614. The flow control valve closes after the last pixel is sent as illustrated by block 1616. The MPEG decoder video prepares to transmit the next picture as illustrated by block 1618. The video encoder transmits the last pixel and sets the end-of-field trigger as illustrated by block 1620.

The register DMA controller executes the end-of-field RUL as illustrated by block 1622 and writes a non-zero value to, in this embodiment, the Display Status Register. The MPEG decoder is interrupted as illustrated by block 1624. The MPEG decoder video feeder responds to the interrupt and clears the Display Status Register as illustrated by block 1626. The method determines if the next field has the new format as illustrated by diamond 1628. If the next field has a new format, the MPEG decoder video feeder asserts the Format change DMA trigger as illustrated by block 1630. The register DMA controller executes a format change RUL as illustrated by block 1632. The last entry writes to the MPEG decoder's Trigger Mask register.

If the next field does not have the new format, the MPEG decoder video feeder asserts the default DMA trigger as illustrated by block 1634. The register DMA controller executes a Default RUL as illustrated by block 1636. The last entry reopens the video feeder's flow control valve as illustrated by block 1638. It is contemplated that, in this example, the format change is detected in the bitstream at least one or more fields before the picture is displayed, when the actual duration depends on the decode latency; display reordering, and other factors. Further, the host response time is shorter than the display latency of the MPEG decoder. Note the display latency varies according to the implementation but usually it is at least one field time due to display reordering. The latency between the video feeder outputting the last pixel and video encoder may vary from a few clocks to more than one line period (if vertical interpolation is used).

It is also contemplated that the previously discussed method for format change may include two interlocks. The first interlock ensures that the pipeline is empty before initiating a format change, preventing a race condition between the previous picture and the register writes for the next picture. The second interlock ensures the format change is completed before sending out the next picture. This interlock is implemented by the video feeder's flow control valve.

It is contemplated that an A/V system or decoder may have multiple pictures in its display queue, such that there are multiple pending format changes in the display pipeline 680. The ordering of such format changes is significant due to such factors as display reordering and playback trick modes. One example illustrating a format change (i.e., a pipelined mode) may be accomplished by extending the interlock mode change scheme provided previously.

In accordance with one embodiment of the present invention, the maximum size of the A/V decoder's display queue is determined. In this embodiment, the MPEG decoder has a number of format change triggers equal to the display queue instead of the one mode change trigger as provided previously. Each such trigger corresponds to a particular picture buffer in the display queue. At the same time, Q DMA descriptors in the register DMA controller are assigned to these triggers.

When the decoder interrupts the host 642 for a format change detected in the bitstream as provided previously, the decoder uses a message register (referred to as a "Format Change ID Register"). The Format Change ID Register is used to notify the host to which display buffer such new format change corresponds. The host responds by setting up the DMA descriptor that is mapped to that buffer. Eventually when that picture is displayed, the MPEG decoder sets off its correct format change trigger to get the intended RUL.

Figure 14:
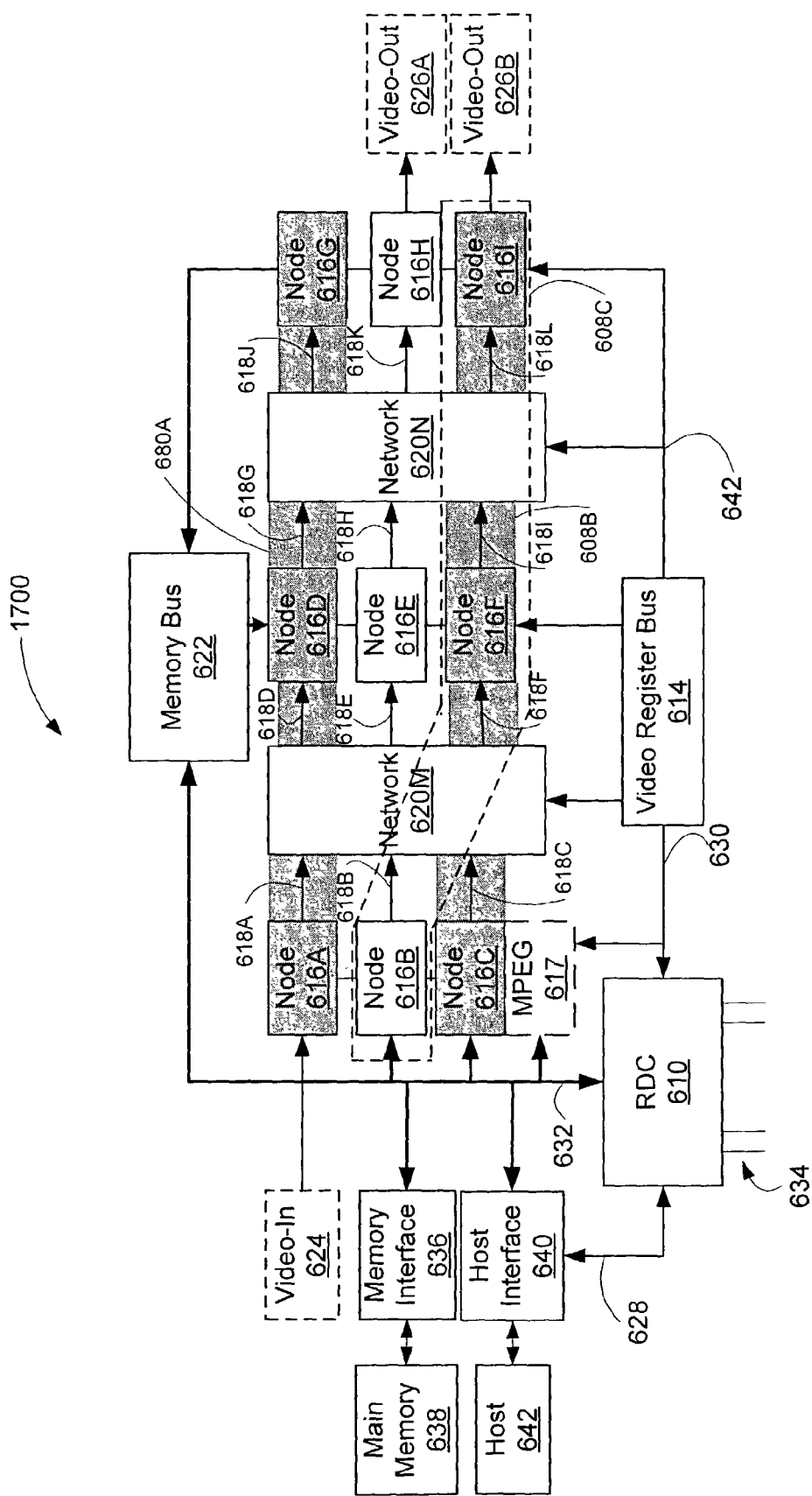
FIG. 14 illustrates one embodiment of a block diagram of a display controller similar to that illustrated in FIG. 3, illustrating a register DMA used in crossbar display controller switching display initialization in accordance with one embodiment of the present invention.

In accordance with one embodiment of the present invention, the Register DMA may be used in crossbar network module switching (switching or changing display pipelines using at least one crossbar switch in a network module for example). FIG. 14 illustrates display controller 1700 having two display pipelines 680A and 680B (highlighted in FIG. 14). In the illustrated embodiment, pipeline 680A comprises nodes 616A, 616D and 616G while pipeline 680B comprise nodes 616C, 616F and 616I. Both network modules 620M and 620N are crossbar network modules, similar to the crossbar network modules or switches provided previously. In this embodiment, the network switching method seamlessly changes highlighted pipeline 680B to pipeline 680C (illustrated by dashed lines in FIG. 14), switching from displaying decoded video to captured video by replacing node 616B (e.g., a playback engine) with node 616C (e.g., a video feeder).

In the illustrated example, changing display pipelines (using network module switching and the register DMA) utilizes the flow control valve of node 616B. One of the programmable DMA triggers of Node 616I (a video encoder for example) is triggered at the end of every field (i.e., End-Of-Field Trigger). Register DMA controller 610 includes at least three DMA channels that are configured similarly to the interlock format change provided previously.

As illustrated the display controller 1700 includes an MPEG decoder 617 that is configured similarly to the interlock format change. MPEG decoder 617 is interrupted when a non-zero is written to its Display Status Register. The interrupt is extended by picking or selecting a first specific value as the resumption code (i.e., the display is ready) and a second specific value as the termination code (i.e., display is disconnected). When the firmware is interrupted, it examines the content of Display Status Register. If the termination code is found, it halts the decoding process.

In this embodiment, the host 642 is configured similarly to that provided previously with respect to the time critical format changes. The host checks at the beginning of every field if there is any user's request to change the video source. It services such request by modifying End-Of-Field DMA. The resumption code writing to Display Status Register is changed to the termination code. In addition, register writes for reconfiguring the display controller are appended to End-Of-Field RUL.

Figure 15A:
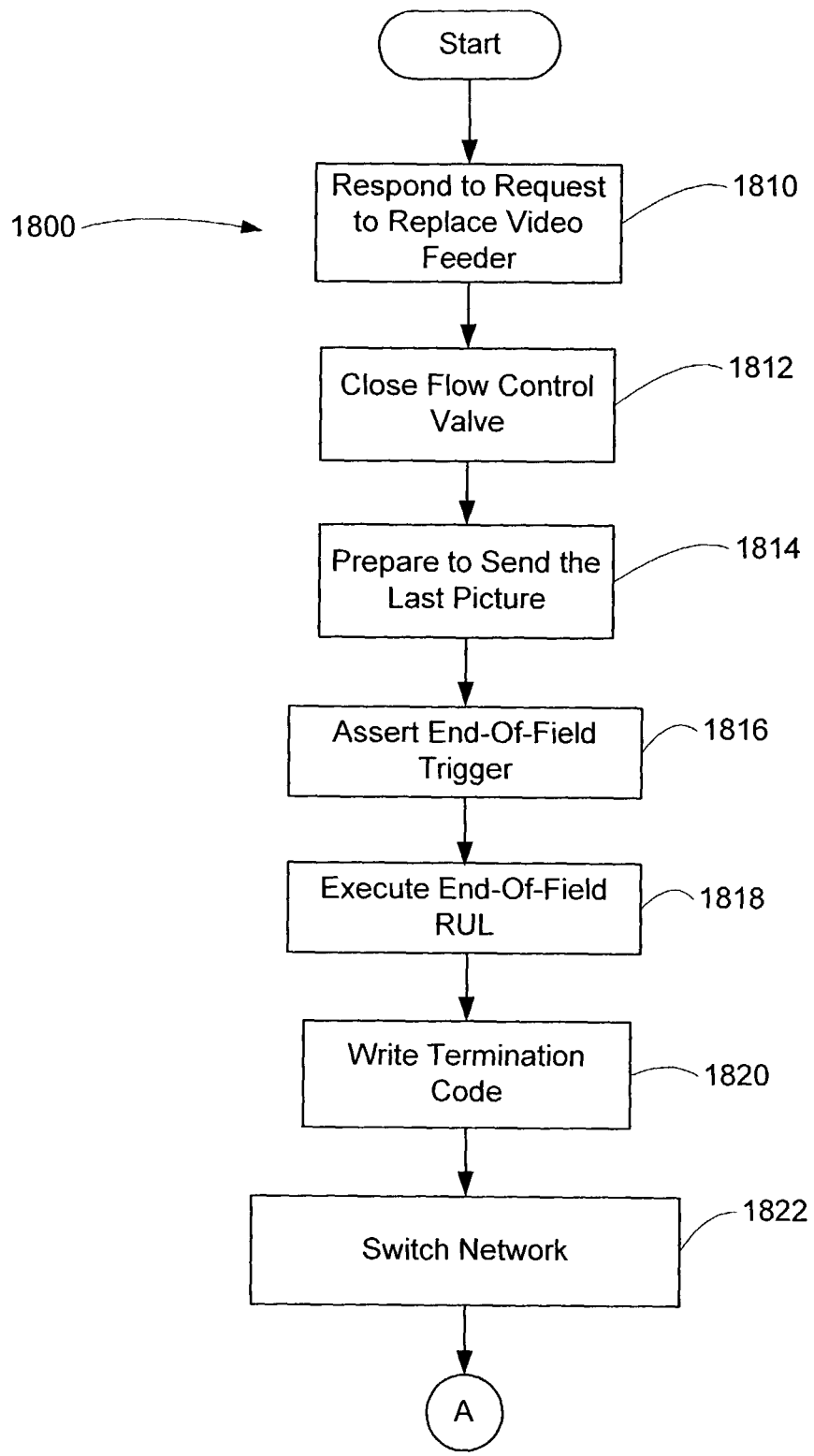
FIGS. 15A and 15B illustrate one embodiment of a flow chart of a method for conducting switching in a display controller in accordance with one embodiment of the present invention.
Figure 15B:
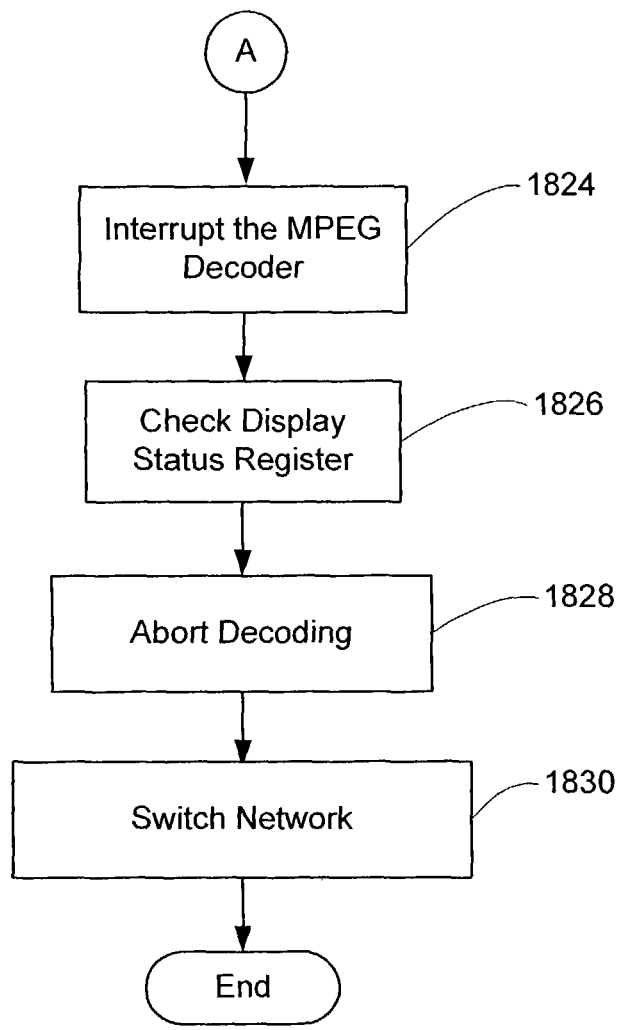

In accordance with the present invention, one method for conducting switching in a display controller using crossbar network modules (similar to that illustrated in FIG. 14), and generally designated 1800, is illustrated in FIGS. 15A and 15B. The host responds to a request (a user's request for example) to replace a node (e.g., replace the video feeder by the playback engine) as illustrated in block 1810. The End-Of-Field DMA is disabled by the Host and its RUL is updated. In one embodiment, the host re-enables the End-Of-Field DMA when the RUL is updated. In accordance with one embodiment, the host modifies the RUL as early in the field as possible to avoid a race condition between the RUL and the DMA.

The decoder's video feeder closes the flow control valve after the last pixel is transmitted as illustrated in block 1812. The decoder's video feeder prepares to transmit the last picture as illustrated by block 1814. The video encoder 616I sends the last pixel and asserts the End-Of-Field Trigger as illustrated by block 1816.

As illustrated, the register DMA controller 610 executes the End-Of-Field RUL as illustrated by block 1818. The register DMA controller 610 writes one or more termination codes to the video decoder and switches one or more network modules as illustrated by blocks 1820 and 1822.

The register DMA controller interrupts the decoder video feeder as illustrated by block 1824. The decoder video feeder checks the display register and then aborts decoding as illustrated by blocks 1826 and 1828. The network M is then switched as illustrated by block 1830. It is contemplated that the crossbar network module, in accordance with the present invention, may be switched without affecting other existing connections.

In accordance with the present invention, one method for conducting switching in a network combines the techniques and methods of time-critical format change and the interlock format change as provided previously. In one example, this method relies on the fact that the field of time is sufficient for the host to respond to a request to change the DMA and its RUL.

In one embodiment, the method uses one or more interrupts (two for example). It is assumed that, in one embodiment, interrupts may be handled by the host in the order that they arrive. In this embodiment, the first interrupt is referred to as a "Capture Interrupt". The capture engine asserts the capture interrupt in the middle of a frame.

In this embodiment, the second interrupt is referred to as the "Playback Interrupt". The playback asserts the playback engine at the end of a frame. A FIFO of two frames (B0 and B1 for example) may be used to buffer the captured pictures before they are displayed. The FIFO is controlled by a read pointer (alternatively referred to as the "RPTR") and a write pointer (alternatively referred to as the "WPTR"). Both the RPTR and WPTR may find four values: 0, 1, 2, and 3, where values 0 and 2 refer to frame B0 and values 1 and 3 refer to frame B1. These two pointers are used for swapping buffers and dropping or repeating frames.

In accordance with one embodiment of the capture/playback method the RPTR and WPTR are initialized to zero and capture is running freely. In the Capture Interrupt handling routine, WPTR is incremented by one, such that:
WPTR=(WPTR+1)% 4.

The FIFO is maintained on the playback side. A frame is dropped if the FIFO is full and repeated if the FIFO is empty. In the Playback Interrupt handling routine, RPTR is updated as follows;
delta=(WPTR−RPTR) % 4;
if (delta==1)
   then RPTR=(RPTR+1) % 4; /* swap buffer */;
else if (delta==2)
   then RPTR=(RPTR+2) % 4; /* full, drop one frame */
else RPTR=RPTR; /* empty, repeat last frame */

Upon startup, RPTR tracks WPTR a few frames. As a result, capture and playback may be set up independently. The timing for the two interrupts may be varied according to the display setting (i.e., positioning and scaling) and interrupt response time.

For non real-time capture, such as decoded MPEG pictures or 3D graphics, dropping and repeating frames is generally undesirable and may be avoided. Avoiding dropping and repeating frames may be accomplished, in one embodiment, by maintaining the FIFO on both sides (i.e., the FIFO is not written if it is full, it is not read if it is empty).

In accordance with one embodiment of the present invention, it is contemplated a number of constraints exist to ensure data is transmitted properly on the video link. For example, the first pixel of a line may be accompanied by an assertion of a New Line signal. An error condition may occur if one of these constraints is violated. An improper hardware configuration or usage, an incorrect video source, a design flaw, or some combination of the above may cause such error condition. Detecting error conditions should, in one exemplary embodiment, prevent the A/V system from hanging, reduce visual artifacts, enable quick recovery and log errors.

A pixel count error occurs when a line is either too long or too short. Such error may be detected in the link or bus by matching the New Line signal with an internal pixel counter, if one is available. For a short line, black pixels may be inserted to replace the missing pixels. For a long line, extra pixels may be drained and discarded. Re-synchronization to the New Line signal may be done promptly.

Analogous to a pixel count error, a line count error occurs when a picture has too many or too few lines. This error may be detected by matching the End-Of-Field signal with an internal line counter, if one is available. For a short picture, extra black lines may be inserted to replace the missing lines. For a long picture, extra lines may be drained and discarded. The End-Of-Field signal may be resynchronized promptly.

A color component error may occur in two ways. The Color Sync signal may become temporarily acyclic or it may lose synchronization because a color component is missing or is inserted redundantly. A design flaw most likely causes this error. Detecting and correcting such error within a few pixels time may be difficult. In one embodiment, such error may be remedied by preventing it from propagating such prevention may be accomplished by synchronizing the Color Sync signal with the New Line signal.

A pixel format error occurs when the expected pixel type is different than what is actually sent. For example, a 24 Bpp RGB picture is sent instead of a 4:4:4 YCrCb picture. Most likely this error is a usage mistake in addition, some links may have restricted usage in terms of pixel format. A proper display controller configuration may fix these errors.

Analogous to a pixel format error, a picture format error occurs when the expected picture type is different form what was sent. For example, a top field is sent but a bottom field is expected. Such error could lead to incorrect filter selection and poor visual quality. Most likely this error is a usage mistake and may be corrected with a proper display controller setup.

Many modifications and variations of the present invention are possible in light of the above teachings. Thus, it is to be understood that, within the scope of the appended claims, the invention may be practiced otherwise than as described hereinabove.

The invention claimed is:

1. A format change system comprising:
a register update list configured to store a plurality of instructions for use in forming a plurality of display pipelines; and
a hardware controller configured to obtain the plurality of instructions via a register bus and to control a configuration of a plurality of nodes to form the plurality of display pipelines using the plurality of instructions from the register update list, each of the plurality of nodes being configured to receive video information and to perform an operation on the received video information, the operation involving more than transmitting the received video information, the plurality of nodes comprising a first set of nodes, a second set of nodes, and a third set of nodes, the nodes in each set connected in parallel to at least one of a plurality of network modules;
wherein the plurality of network modules are configured to interconnect a node from the first set of nodes, a node from the second set of nodes, and a node from the third set of nodes to form each of the plurality of display pipelines;
the hardware controller configured to form a first display pipeline of the plurality of display pipelines in response to obtaining at least one first instruction from the register update list, the first display pipeline comprising a first node selected from the first set of nodes, a second node selected from the second set of nodes, and a third node selected from the third set of nodes, the first, second and third nodes selected for inclusion in the first display pipeline using the at least one first instruction, the hardware controller configured to form the first display pipeline by controlling at least one switch of each of the plurality of network modules to chain the first, second and third nodes together based on the at least one first instruction; and the hardware controller configured to form a second display pipeline of the plurality of display pipelines in response to obtaining at least one second instruction from the register update list, the second display pipeline comprising a fourth node selected from the first set of nodes, a fifth node selected from the second set of nodes, and a sixth node selected from the third set of nodes, the fourth, fifth and sixth nodes selected for inclusion in the second display pipeline using the at least one second instruction, the hardware controller configured to form the second display pipeline by controlling the at least one switch of each of the plurality of network modules to chain the fourth, fifth and sixth nodes together based on the at least one second instruction, wherein at least one of:

the fourth node is different than the first node;
the fifth node is different than the second node; or
the sixth node is different than the third node.

2. The system of claim 1, wherein the hardware controller comprises a register DMA controller.

3. The system of claim 1, wherein the hardware controller obtains the plurality of instructions from the register update list in response to a trigger signal.

4. The system of claim 1, further comprising a plurality of interfaces coupled to the hardware controller.

5. The system of claim 4, wherein at least one of the interfaces communicates a trigger signal to the hardware controller.

6. The system of claim 1, wherein the hardware controller comprises at least one DMA engine that accesses the register update list.

7. The system of claim 2, wherein the hardware controller comprises at least one filter that lowers a response time of the register DMA controller.

8. The system of claim 1, wherein the hardware controller comprises at least one multiplexer that converts at least one access to the register update list into at least one register write.

9. The system of claim 1, wherein the hardware controller obtains and uses the at least one second instruction from the register update list to switch from the first display pipeline to the second display pipeline within 1/60 second from forming the first display pipeline.

10. The system of claim 1, wherein the hardware controller pulls the plurality of instructions from the register update list.

11. The system of claim 1, wherein each of the plurality of instructions comprises an address to which the instruction is directed and corresponding data for the instruction, and wherein, via the address, the hardware controller directly configures at least one of the plurality of nodes by writing the data to a control register of the at least one node of the plurality of nodes.

12. The system of claim 1, the hardware controller configured to switch from the first display pipeline to the second display pipeline by controlling the at least one switch to perform at least one of:

disconnecting the first node and connecting the fourth node;
disconnecting the second node and connecting the fifth node; or
disconnecting the third node and connecting the sixth node.

13. The system of claim 1, the hardware controller configured to control the plurality of network modules, the plurality of network modules comprising a first network module configured to connect a first node selected from the first set of nodes to a second node selected from the second set of nodes, a second network module configured to connect the second node to a third node selected from the third set of nodes, the first, second, and third nodes forming one display pipeline of the plurality of display pipelines, the hardware controller configured to:

control a switch of the first network module to connect the first node to the second node based on at least one of the plurality of instructions; and
control a switch of the second network module to connect the second node to the third node based on the at least one of the plurality of instructions;
the first node, second node, and third node determined from among the first set of nodes, second set of nodes, and third set of nodes, respectively, based on the at least one of the plurality of instructions.

14. A format change system comprising:

a plurality of display controller nodes, each of the plurality of display controller nodes configured to receive video information and to perform an operation on the received video information, the operation involving more than transmitting the received video information, the plurality of display controller nodes comprising a first set of display controller nodes, a second set of display controller nodes, and a third set of display controller nodes;

a register update list configured to store a plurality of instructions for use in forming a plurality of display pipelines;

a register DMA controller configured to obtain the plurality of instructions via a register bus and to control a configuration of a plurality of display controller nodes to form the plurality of display pipelines using the plurality of instructions from the register update list; and a plurality of network modules configured to interconnect a node from the first set of display controller nodes, a node from the second set of display controller nodes, and a node from the third set of display controller nodes to form each of the plurality of display pipelines, the nodes in each set of nodes connected in parallel to at least one of the plurality of network modules;

the register DMA controller configured to form a first display pipeline of the plurality of display pipelines in response to obtaining at least one first instruction from the register update list, the first display pipeline comprising a first display controller node selected from the first set of display controller nodes, a second display controller node selected from the second set of display controller nodes, and a third display controller node selected from the third set of display controller nodes, the first, second and third display controller nodes selected for inclusion in the first display pipeline using the at least one first instruction, the register DMA controller configured to form the first display pipeline by controlling at least one switch of each of the plurality of network modules to chain the first, second and third display controller nodes together based on the at least one first instruction, the first display pipeline configured to apply a first type of processing to the video information via the first, second and third display controller nodes; and the register DMA controller configured to form a second display pipeline of the plurality of display pipelines in response to obtaining at least one second instruction from the register update list, the second display pipeline comprising a fourth display controller node selected from the first set of display controller nodes, a fifth display controller node selected from the second set of display controller nodes, and a sixth display controller node selected from the third set of display controller nodes, the register DMA controller configured to form the second display pipeline by controlling the at least one switch of each of the plurality of network modules to chain the fourth, fifth and sixth display controller nodes together based on the at least one second instruction, the second display pipeline configured to apply a second type of processing to the video information via the fourth, fifth and sixth display controller nodes, wherein at least one of:

the fourth node is different than the first node;
the fifth node is different than the second node; or
the sixth node is different than the third node.

15. The system of claim 14, wherein the register DMA controller obtains the plurality of instructions from the register update list in response to a trigger signal.

16. The system of claim 14, wherein one or more of the display controller nodes is coupled to the register DMA controller using an interface.

17. The system of claim 16, wherein the interface is adapted to communicate a trigger to the register DMA controller.

18. The system of claim 14, wherein the register DMA controller comprises at least one filter that lowers a response time of the register DMA controller.

19. The system of claim 14, wherein the register DMA controller pulls the plurality of instructions from the register update list.

20. The system of claim 14, wherein each of the plurality of instructions comprises an address to which the instruction is directed, and wherein, via the address, the register DMA controller directly configures at least one of the plurality of display controller nodes by writing data to a control register of the at least one display controller node.

21. A method comprising:

retrieving a plurality of instructions for use in forming a plurality of display pipelines from a register update list stored in a memory; and controlling a configuration of a plurality of nodes to form the plurality of display pipelines using the plurality of instructions from the register update list, each of the plurality of nodes configured to receive video information and to perform an operation on the received video information, the operation involving more than transmitting the received video information, the plurality of nodes comprising a first set of nodes, a second set of nodes, and a third set of nodes, wherein a plurality of network modules are configured to interconnect a node from the first set of nodes, a node from the second set of nodes, and a node from the third set of nodes to form each of the plurality of display pipelines, the nodes in each set connected in parallel to at least one of the plurality of network modules, the controlling the configuration of the plurality of nodes comprising:

forming a first display pipeline of the plurality of display pipelines in response to obtaining at least one first instruction from the register update list by controlling at least one switch of each of the plurality of network modules to chain a first node selected from the first set of nodes, a second node selected from the second set of nodes and a third node selected from the third set of nodes together based on the at least one first instruction; and forming a second display pipeline of the plurality of display pipelines in response to obtaining at least one second instruction from the register update list by controlling the at least one switch of each of the plurality of network modules to chain a fourth node selected from the first set of nodes, a fifth node selected from the second set of nodes and a sixth node selected from the third set of nodes together based on the at least one second instruction, wherein at least one of:

the fourth node is different than the first node;

the fifth node is different than the second node; or the sixth node is different than the third node.

* * * * *